US010491485B2

(12) United States Patent
Dome et al.

(10) Patent No.: US 10,491,485 B2
(45) Date of Patent: Nov. 26, 2019

(54) EXPANSIVE NETWORK CONTROL DESIGN SYSTEM

(71) Applicant: AT&T Intellectual Property I, L.P., Atlanta, GA (US)

(72) Inventors: George Dome, Tinton Falls, NJ (US); John Oetting, Zionsville, PA (US); Chuxin Chen, San Francisco, CA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 15/827,440

(22) Filed: Nov. 30, 2017

(65) Prior Publication Data

US 2019/0166010 A1 May 30, 2019

(51) Int. Cl.
*G06F 15/173* (2006.01)
*H04L 12/24* (2006.01)
(Continued)

(52) U.S. Cl.
CPC ............ *H04L 41/147* (2013.01); *A63F 13/35* (2014.09); *A63F 13/46* (2014.09); *A63F 13/822* (2014.09);
(Continued)

(58) Field of Classification Search
CPC .......... G06N 20/00; G06N 5/04; G06N 7/005; G06N 3/08; G06N 3/006; G06N 5/022;
(Continued)

(56) References Cited

U.S. PATENT DOCUMENTS 9,398,467 B2 7/2016 Schultz et al.
9,609,011 B2 3/2017 Muddu et al.
(Continued)

OTHER PUBLICATIONS

"ATRIAA — Automated Threat/Risk Identification, Analysis and Action"; AT&T Intellectual Property; White Paper; Aug. 2, 2011; 5 pages.

*Primary Examiner* — Michael A Keller
*Assistant Examiner* — Thao D Duong
(74) *Attorney, Agent, or Firm* — BakerHostetler

(57) ABSTRACT

A system for expansive network control comprising: a development engine includes a scenario building engine configured to build an abstracted view of at least one sub-network based on a network inventory; a gamification engine communicating with a user input/output device providing at least one simulated scenario involving a simulated network threat to the user input/output device; and a machine learning engine communicating with the gamification engine, wherein the machine learning engine generates at least one strategy, the machine learning engine capturing the scenario and the user input from the user input/output device; an expansive network control operation engine includes an expansive network control engine communicating with the machine learning engine; an execution engine communicating with the expansive network control engine; a threat detection engine communicating with at least one external threat data source, the at least one external threat data source including at least one of weather, seismic, natural disaster, law enforcement, news and public utility data; wherein the threat detection engine monitors the at least one data source to detect a threat and passes a threat type and an impacted sub-network location for the threat type to the expansive network control engine; wherein the expansive network control engine is configured to retrieve at least one of an available inventory and priority of the impacted sub-network; wherein based on the at least one strategy, the expansive network control engine triggers the execution engine to perform an action to address the threat; an expansive network planning engine includes a simulation engine; the simulation engine configured to trigger an event and record a simulation result of the event; and a spare recommender, wherein the simulation engine communicates the simulation result to the spare recommender and wherein (Continued)

the spare recommender analyzes the simulation result to determine if excessive spares exist.

10 Claims, 16 Drawing Sheets

(51) Int. Cl.
    *A63F 13/822*     (2014.01)
    *A63F 13/46*     (2014.01)
    *G06F 17/50*     (2006.01)
    *G06N 20/00*     (2019.01)
    *A63F 13/35*     (2014.01)

(52) U.S. Cl.
    CPC ......... *G06F 17/5009* (2013.01); *G06N 20/00* (2019.01); *H04L 41/145* (2013.01); *H04L 41/12* (2013.01); *H04L 41/16* (2013.01)

(58) Field of Classification Search
    CPC . G06N 10/00; H04L 63/1425; H04L 63/1433; H04L 63/1416; H04L 63/1441; H04L 63/20
    See application file for complete search history.

(56) References Cited

U.S. PATENT DOCUMENTS

| | | |
|---|---|---|
| 9,635,050 B2 | 4/2017 | Di Pietro et al. |
| 9,667,641 B2 | 5/2017 | Muddu et al. |
| 2016/0080399 A1 | 3/2016 | Harris et al. |
| 2017/0214708 A1 | 7/2017 | Gukal et al. |
| 2017/0235960 A1 | 8/2017 | Austin |
| 2017/0289191 A1 | 10/2017 | Thioux et al. |

EXPANSIVE NETWORK CONTROL DESIGN SYSTEM

TECHNICAL FIELD

This disclosure relates generally to network management and, more specifically, to an expansive network control design system. Most particularly, the disclosure relates to a system that assesses network capability, risk factor and failure data and design rules to provide network design, rerouting and allocation.

BACKGROUND

Communication networks have migrated from using specialized networking equipment executing on dedicated hardware, like routers, firewalls, and gateways, to software defined networks (SDNs) executing as virtualized network functions (VNF) in a cloud infrastructure. To provide a service, a set of VNFs may be instantiated on the general purpose hardware. Each VNF may require one or more network devices or virtual machines (VMs) to be instantiated. In turn, VMs may require various resources, such as memory, virtual computer processing units (vCPUs), and network interfaces or network interface cards (NICs). Determining how to assign these resources among VMs in an efficient manner may be unbearably complex.

In building resiliency in the physical transport network today, individual platforms use design rules for creating diverse links and survivability. In a shared transport network, the aggregation of various traffic types on common physical spans can create high risk for major outages when physical paths go down due to fiber cuts, transport equipment failures, fiber degradation, etc. Long single threaded spans with aggregation of more and more traffic on common spans can also result in high risk of major customer impacting outages. Currently, when a network threat is detected, reactive controls are used to stop traffic causing the network harm, for example, volume related congestion or hacker attacks. These controls provide priority connections to make the most efficient use of network resources and inhibit traffic congestion to prevent it from spreading and overwhelming the network. The most common prioritization is to limit communications into an area experiencing an event while allowing communications from within the event area out. In a software defined network environment, it is desirable to improve this response by providing greater flexibility in prioritizing network use in an affected area, leveraging existing spares or otherwise expanding the network to address a threat event. It is also desirable to proactively develop strategies to respond to various threats.

This disclosure is directed to solving one or more of the problems in the existing technology.

SUMMARY

According to an example, the disclosure generally provides an expansive network control system that optimizes use of network and application resources to move or expand critical functions using spare and other resources of non-critical applications to complete service paths. The system also allows expansion of capacity to complete customer service paths.

According to another example, the disclosure generally provides a system for expansive network control comprising: a development engine includes a scenario building engine configured to build an abstracted view of at least one sub-network based on a network inventory; a gamification engine communicates with a user input/output device providing at least one simulated scenario involving a simulated network threat to the user input/output device; and a machine learning engine communicating with the gamification engine, wherein the machine learning engine generates at least one strategy, the machine learning engine capturing the scenario and the user input from the user input/output device; an expansive network control operation engine includes an expansive network control engine communicates with the machine learning engine; an execution engine communicates with the expansive network control engine; a threat detection engine communicates with at least one external threat data source, the at least one external threat data source including at least one of weather, seismic, natural disaster, law enforcement, news and public utility data; wherein the threat detection engine monitors the at least one data source to detect a threat and passes a threat type and an impacted sub-network location for the threat type to the expansive network control engine; wherein the expansive network control engine is configured to retrieve at least one of an available inventory and priority of the impacted sub-network; wherein based on the at least one strategy, the expansive network control engine triggers the execution engine to perform an action to address the threat; an expansive network planning engine includes a simulation engine; the simulation engine configured to trigger an event and record a simulation result of the event; and a spare recommender, wherein the simulation engine communicates the simulation result to the spare recommender and wherein the spare recommender analyzes the simulation result to determine if excessive spares exist.

Still another example provides network device comprising: a processor, an input/output device coupled to the processor, and a memory coupled with the processor, the memory comprising executable instructions that when executed by the processor cause the processor to effectuate operations comprising: instantiating a scenario building engine as a virtual network function; instantiating a network control engine as a virtual network function; instantiating a gamification engine as a virtual network function and instantiating a machine learning engine as a virtual network function; providing a resource inventory for at least a portion of the network to the scenario building engine; building a scenario based on the resource inventory, wherein the scenario includes at least one threat to the resource inventory; at least one of the gamification engine and the machine learning engine defining a strategy for response to the threat; providing the strategy to the network control engine.

BRIEF DESCRIPTION OF THE DRAWINGS

In the following description, for purposes of explanation, numerous specific details are set forth in order to provide an understanding of the variations in implementing the disclosed technology. However, the instant disclosure may take many different forms and should not be construed as limited to the examples set forth herein. Where practical, like numbers refer to like elements throughout.

DETAILED DESCRIPTION

Network threats (e.g., cable cuts, hardware failures, traffic surges from mass calling or flash crowds, hacker attacks, natural disasters etc.) can stop or severely impede customer traffic. The examples described herein relate to an expansive network control system to address such threats. The expansive network control approach utilizes virtual network and application resources to move or expand critical functions in response to a network threat to allow temporary expansion of available capacity to complete customer service paths, as described more completely below.

Figure 1A:
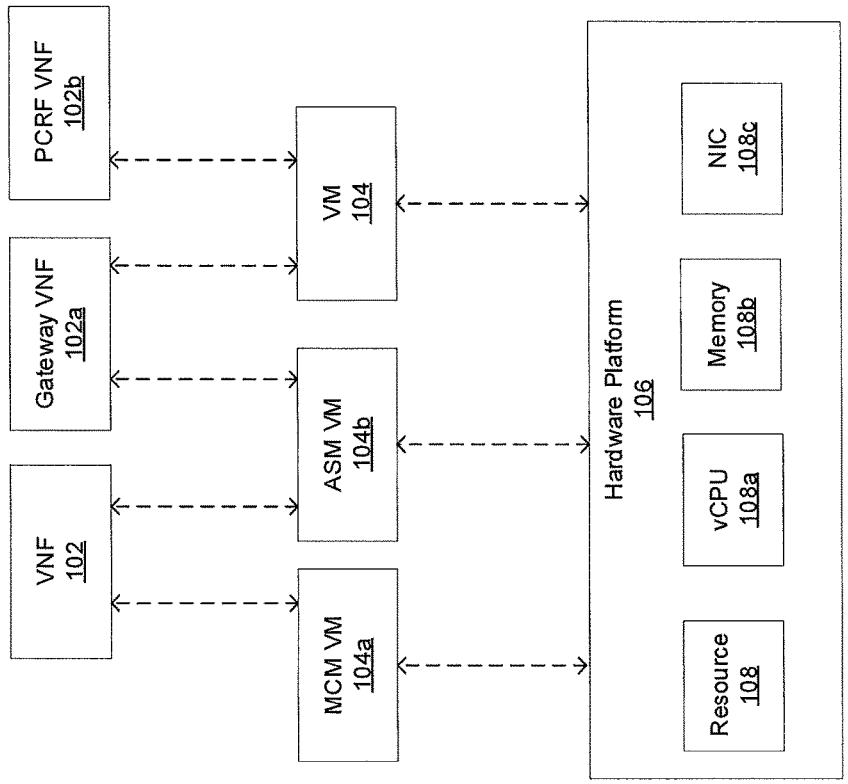
FIG. 1A is a representation of an exemplary network.

FIG. 1A is a representation of an exemplary network 100. Network 100 may comprise a software defined network or SDN—that is, network 100 may include one or more virtualized functions implemented on general purpose hardware, such as in lieu of having dedicated hardware for every network function. That is, general purpose hardware of network 100 may be configured to run virtual network elements to support communication services, such as mobility services, including consumer services and enterprise services. These services may be provided or measured in sessions.

A virtual network function(s) (VNF) 102 may a VNF type that indicates its functionality or role. For example, FIG. 1A illustrates a gateway VNF 102a and a policy and charging rules function (PCRF) VNF 102b. Additionally or alternatively, VNFs 102 may include other types of VNFs. Each VNF 102 may use one or more virtual machine (VM) 104 to operate. Each VM 104 may have a VM type that indicates its functionality or role. For example, FIG. 1a illustrates a management control module (MCM) VM 104a and an advanced services module (ASM) VM 104b. Additionally or alternatively, VM 104 may include other types of VMs. Each VM 104 may consume various network resources from a hardware platform 106, such as a resource 108, a virtual central processing unit (vCPU) 108a, memory 108b, or a network interface card (NIC) 108c. Additionally or alternatively, hardware platform 106 may include other types of resources 108.

Figure 1B:
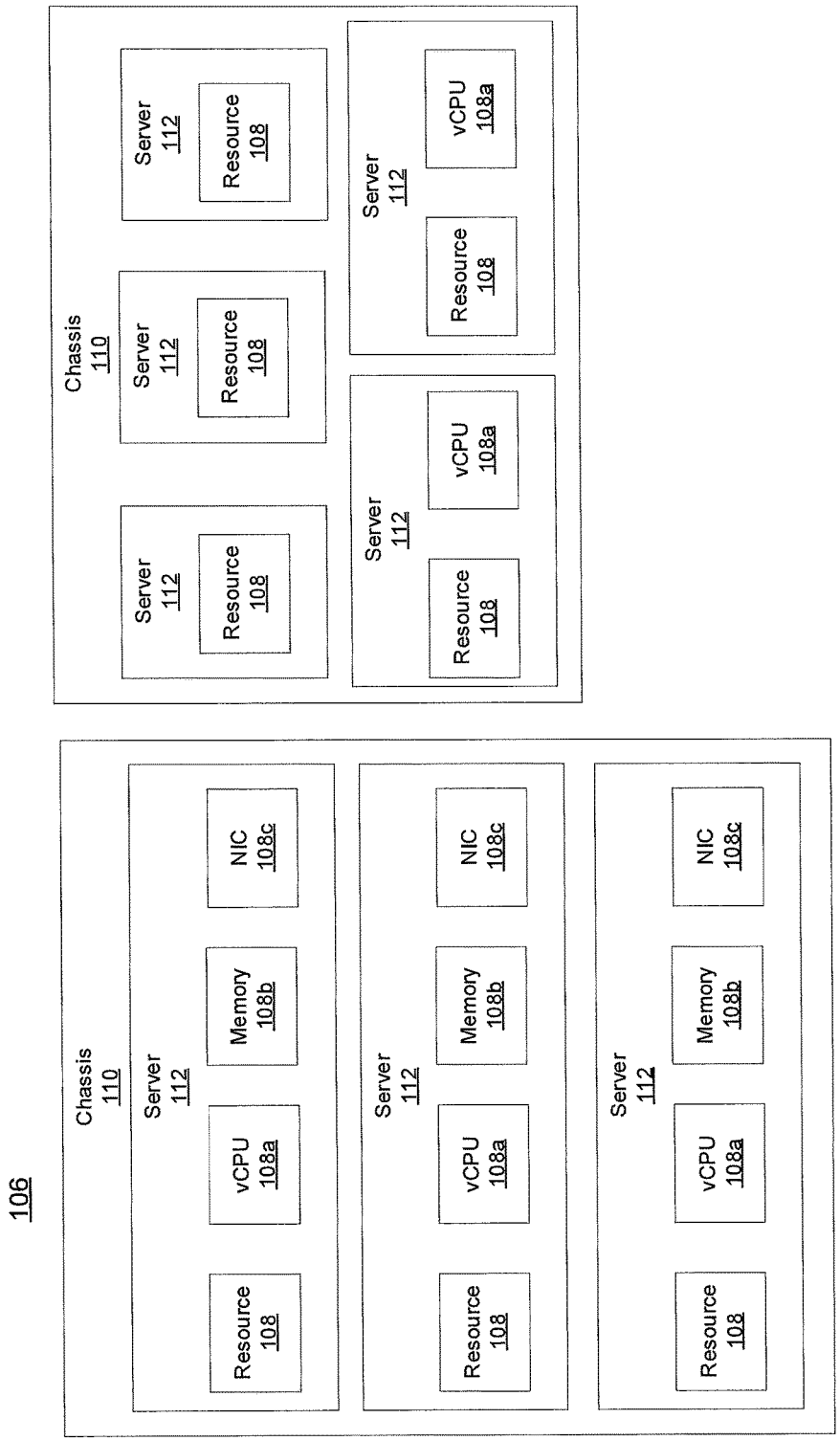
FIG. 1B is a representation of an exemplary hardware platform.

While FIG. 1A illustrates resources 108 as collectively contained in hardware platform 106, the configuration of hardware platform 106 may isolate, for example, certain memory 108b from other memory 108a. FIG. 1b provides an exemplary implementation of hardware platform 106.

Hardware platform 106 may comprise one or more chassis 110. Chassis 110 may refer to the physical housing or platform for multiple servers or other network equipment. In an aspect, chassis 110 may also refer to the underlying network equipment. Chassis 110 may include one or more servers 112. Server 112 may comprise general purpose computer hardware or a computer. In an aspect, chassis 110 may comprise a metal rack, and servers 112 of chassis 110 may comprise blade servers that are physically mounted in or on chassis 110.

Each server 112 may include one or more network resources 108, as illustrated. Servers 112 may be communicatively coupled together in any combination or arrangement. For example, all servers 112 within a given chassis 110 may be communicatively coupled. As another example, servers 112 in different chassis 110 may be communicatively coupled. Additionally or alternatively, chassis 110 may be communicatively coupled together in any combination or arrangement.

The characteristics of each chassis 110 and each server 112 may differ. For example, FIG. 1B illustrates that the number of servers 112 within two chassis 110 may vary. Additionally or alternatively, the type or number of resources 110 within each server 112 may vary. In an aspect, chassis 110 may be used to group servers 112 with the same resource characteristics. In another aspect, servers 112 within the same chassis 110 may have different resource characteristics.

Given hardware platform 106, the number of sessions that may be instantiated may vary depending upon how efficiently resources 108 are assigned to different VMs 104. For example, assignment of VMs 104 to particular resources 108 may be constrained by one or more rules. For example, a first rule may require that resources 108 assigned to a particular VM 104 be on the same server 112 or set of servers 112. For example, if VM 104 uses eight vCPUs 108a, 1 GB of memory 108b, and 2 NICs 108c, the rules may require that all of these resources 108 be sourced from the same server 112. Additionally or alternatively, VM 104 may require splitting resources 108 among multiple servers 112, but such splitting may need to conform to certain restrictions. For example, resources 108 for VM 104 may be able to be split between two servers 112. Default rules may apply. For example, a default rule may require that all resources 108 for a given VM 104 must come from the same server 112.

Figure 2:
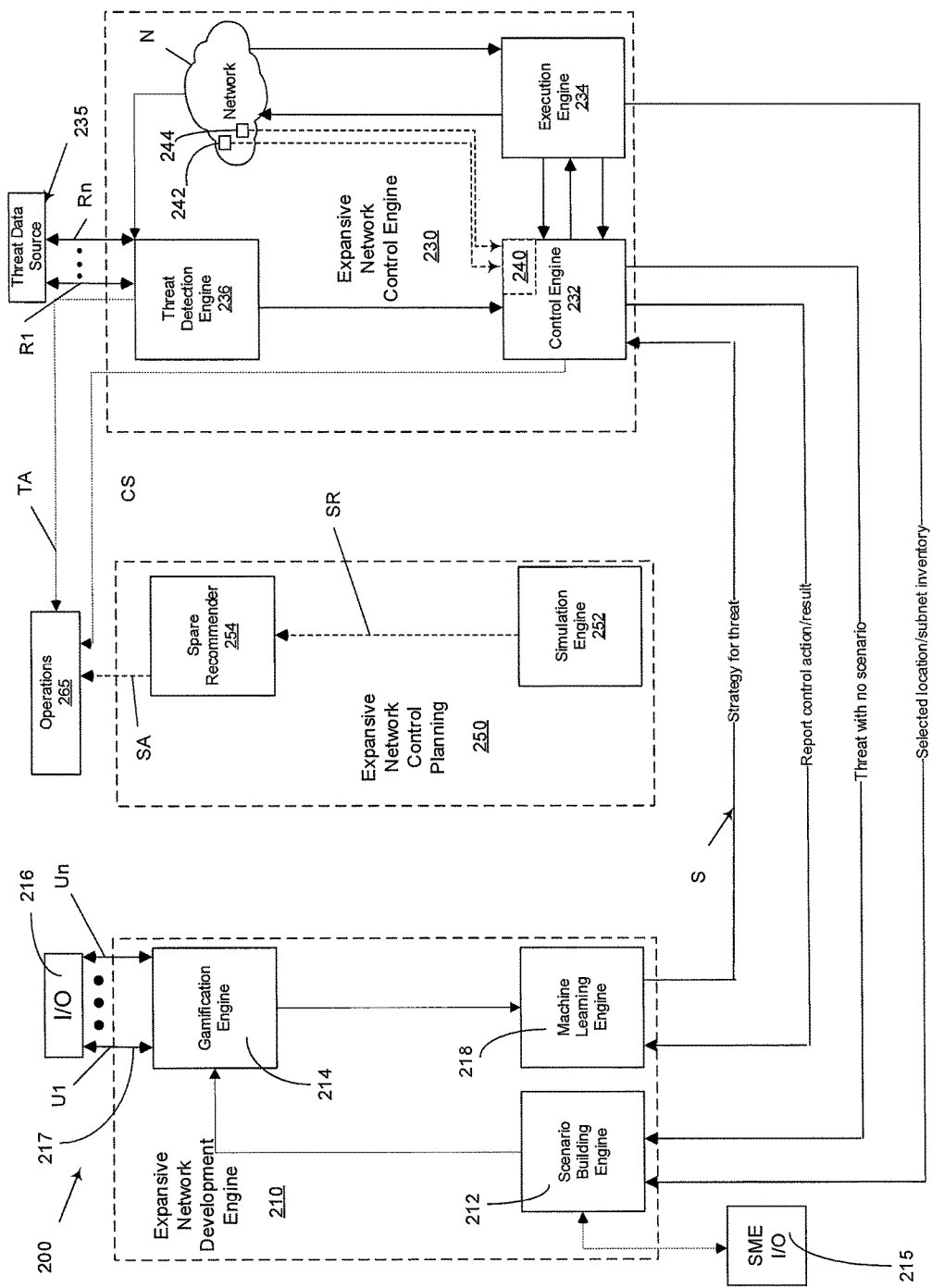
FIG. 2 is a representation of a system for expansive network control according to an example.
Figure 2A:
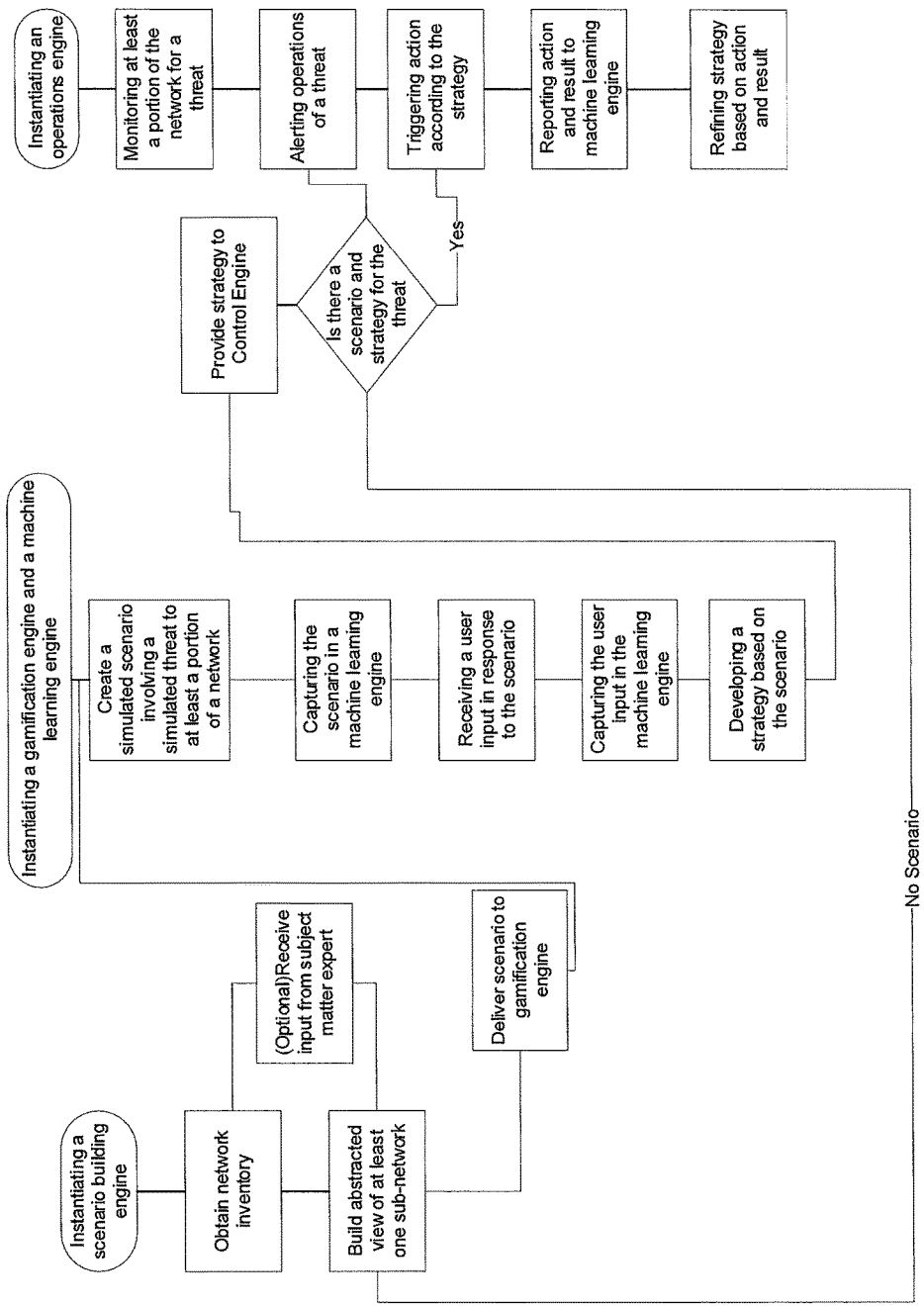
FIG. 2A is a flow diagram depicting operation of the system for expansive network control according to an example.

With reference to FIG. 2, an expansive network control system is generally indicated by the number 200. System 200 generally includes an expansive network development engine 210, an expansive network operation engine 230, and an expansive network planning engine 250.

Development engine 210 includes a scenario building engine 212 configured to build an abstracted view of at least one sub-network 211 based on a network inventory 213. Scenario building engine 212 may communicate with a subject matter expert (SME) input/output device 215. SME input/output device 215 may receive input from a subject matter expert to inform the building of the abstracted view. Development engine 210 may also include a gamification engine 214 that communicates with a user input/output device 216 providing at least one simulated scenario 217 (FIG. 2B) involving a simulated network threat T to the user input/output device 216. Development engine 210 may also include a machine learning engine 218 that communicates with the gamification engine 214. The machine learning engine 218 generates at least one strategy S. The machine learning engine 218 also captures the scenario and the user input from the user input/output device 216. The strategy S may be saved in memory or other data store for use in response to an actual threat. Simulations may include various threats and strategy S may be saved with reference to at least one of the threat type, resources involved, network function, network or subnet location, or other criteria to facilitate its retrieval for further gamification, machine learning or use in response to an actual threat. In the depicted example, the expansive network control development engine 210 may transmit a scenario based on a specific threat type to the operations engine 230 for execution. As further shown in the example, control engine 232 may communicate threats for which it has no scenario or strategy to facilitate building of a scenario and/or strategy for such threats.

The expansive network operation engine 230 includes a control engine 232 communicates with the machine learning engine 218. Expansive network operation engine 230 may further include an execution engine 234 communicates with the control engine 232, and a threat detection engine 236 that communicates with at least one external threat data source 235. The at least one external threat data source 235 may include at least one of weather, seismic, volcanic, and satellite data sources; unnatural and natural disaster data sources; law enforcement and other government data sources; social media sources; news data sources, and public utility data sources. Threat data source 235 may also include data from internet of things devices, sensors, and surveillance sources. The threat data source 235 may, therefore, provide one or more reports (R1 . . . Rn) to updating threat detection engine 236 on potential threats. In addition, threat detection engine 236 may be configured to query threat data sources to selectively obtain such reports. The threat detection engine 236 monitors the at least one data source 235 to detect a potential threat T and passes a threat type and an impacted sub-network location for the threat type to the control engine 232. The control engine 232 is configured to retrieve at least one of an available inventory and priority of the impacted sub-network based on the at least one strategy S. To that end, control engine 232 may include or communicate with at least one network data source 240. This data source 240 may receive data from an operations tool 242, such as a performance management tool (PMT) to monitor internet protocol traffic, congestion, jitter, dropped ports, link performance including but not limited to track performance failures and bounce incidents. Data source 240 may also include an active and available inventory database 244, such as a Granite, Cramer, Tirks or Geolink database. The active and available inventory database 244 may include an open network automation platform (ONAP) subsystem that provides a real-time view of available resources, services and their relationships including but not limited to a registry of active, available, and assigned assets along with multi-dimensional relationships among the assets including relevance to different components of an ONAP. Based on data from network data source 240 and strategy S, the control engine 232 triggers the execution engine 234 to perform an action to address the potential threat T.

System 200 may include an expansive network planning engine 250. Expansive network planning engine 250 may include a simulation engine 252 and a spare recommender 254. The planning engine 250 monitors network capacity by monitoring the available i.e. spare devices, virtual network functions, or network devices within at least a portion of the network N, for example, via data source 240. The simulation engine 252 is configured to trigger an event and record a simulation result of the event. The simulation engine 252 communicates the simulation result SR to the spare recommender 254 for analysis. The spare recommender 254 analyzes the simulation result to determine if required or excessive spares per office exist. Simulation engine 252 triggers a simulation event to control engine 232 at 255, and based on the simulation results analyzes the results and communicates with spare recommender 254.

System 200 may further include an operations input/output device or simply operations 265. In the example, control engine 232 transmits a control status signal CS to operations 265. Control status signal CS may include but is not limited to status of control engine triggers or other actions initiated by control engine 232. Threat detection engine 236 may communicate a threat alert TA to operations 265. Spare recommender may communicate a spare alert SA to identify the spares available to operations 265.

Figure 2B:
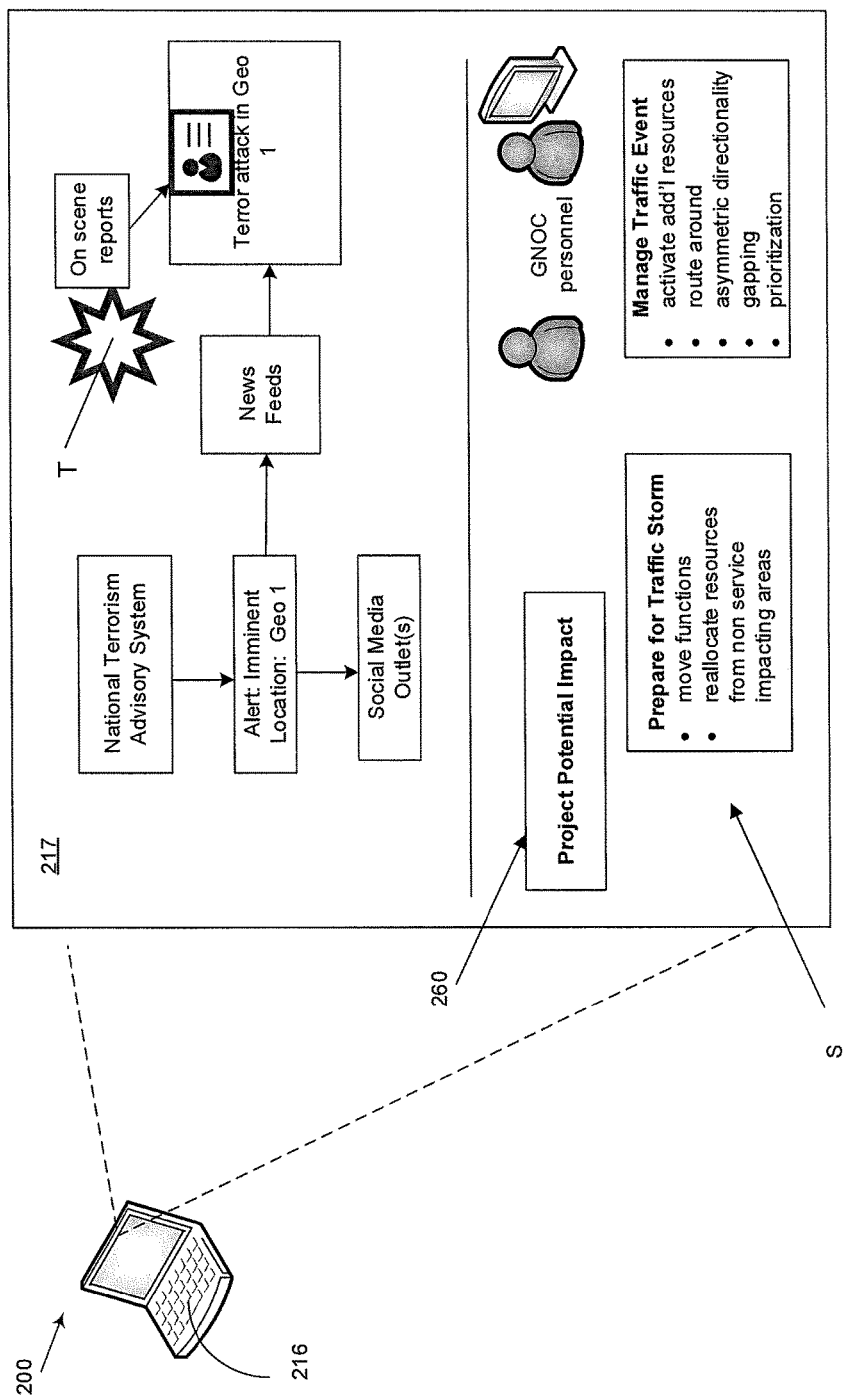
FIG. 2B is a schematic view depicting a user interface of the system for expansive network control according to an example.
Figure 2C:
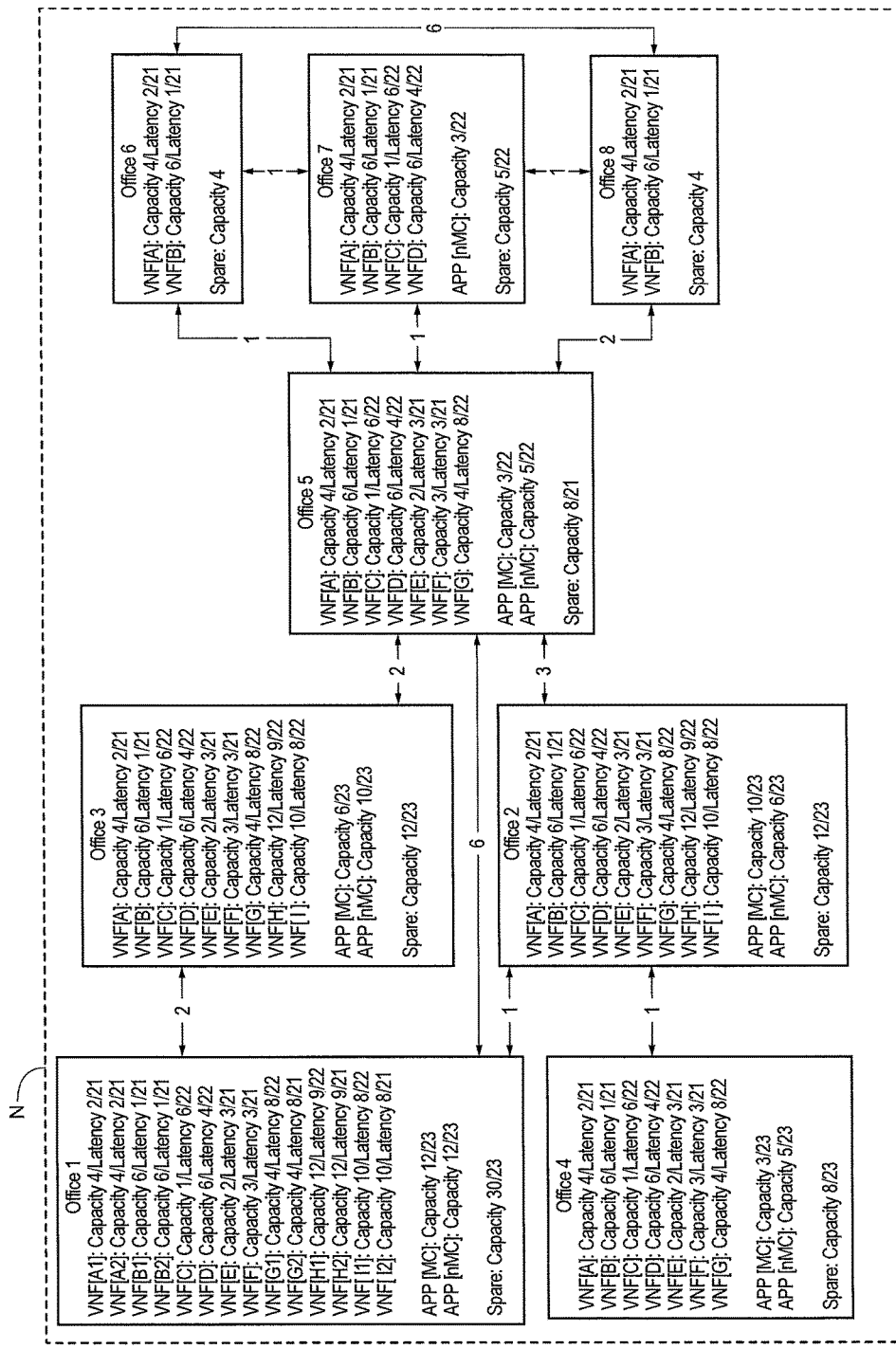
FIG. 2C is a schematic view depicting an office hierarchy within a network according to an example.
Figure 2D:
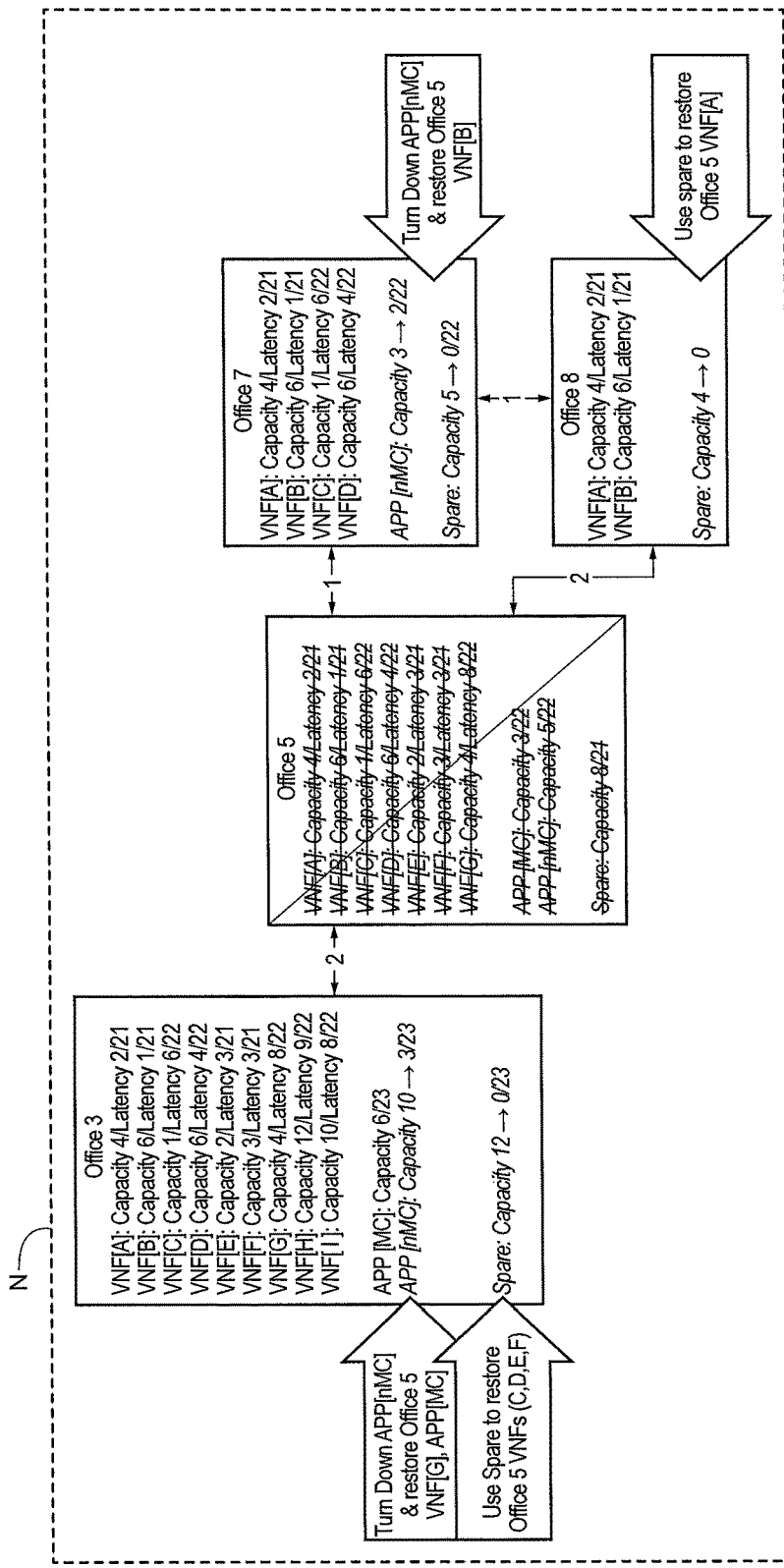
FIG. 2D is a schematic view similar to FIG. 2C depicting operation of the system after a threat according to an example.

With reference to FIG. 2B, an example simulation is shown. There, a threat T in the form of a potential terror attack is being reported through an alert from a national terrorism advisory system. This alert is shown as being transmitted to social media feeds, and news feeds. The news feeds are fed to broadcast media and supported by on scene reporting. The threat T is assessed to determine the potential impact at 260, and a strategy S is formulated to prepare for a traffic storm that will flow from the threat. For example, as shown, strategy S may include moving functions, and real-locating resources from non-service impacting areas. Strategy S may also include activating additional resources, routing around the resources impacted by threat T, and performing asymmetric directionality, gapping, or prioritization functions to better allocate and leverage resources RE. With reference to FIGS. 2C and 2D, using an office hierarchy as an example, FIG. 2C shows the offices before the threat T. FIG. 2D schematically depicts the loss of office 5 during the threat T.

With reference to FIG. 2C, an example network N includes 8 offices having various resources including but not limited to VNFs and APPs. As schematically shown, offices each may be of various size and make-up. The make-up of each office may include various resources including resources that have higher priority in terms of office function and operation. Higher priority elements may be elements that would not be turned down or disabled to preserve office functionality. For example, a mission critical (MC) device, virtual network function, network device or the like is a higher priority element including but not limited to 911 functionality, call support or customer application support. In contrast, a non-mission critical (nMC) element including but not limited to reporting or billing functionality. It will be understood that other criteria may be used to set priority. An office may represent a physical i.e. brick and mortar office, a geographical region, or other defined grouping of network elements. The network elements in each office may include hardware and/or software defined elements as described herein. Office may include elements that are commonly owned or shared between entities. The office example is used to show an example hierarchy involving a simplified list of resources. These examples should, therefore, not be considered limiting. Within the office hierarchy, resources may also be assigned or partitioned into zones. Zones are an arbitrary packaging of elements to facilitate distribution of resources. Zones can be assigned with different levels of granularity for different purposes. The examples shown, therefore, should not be considered limiting. Packaging the resources in zones allows the packaged resources to be moved or reassigned as needed. In the example, resources are apportioned amongst three zones i.e. Z1 (zone 1), Z2 (zone 2), and Z3 (zone 3).

With reference to FIG. 2D, to restore the functionality provided by office 5, strategy S includes turning down APP(nMC) to restore office 5 VNF(G) and APP(MC) in office 3. Spare capacity from office 3 is used to restore office 5 VNFs(C,D,E,F). Turning down APP(nMC) in office 7 and using spare capacity in office 7 to restore office 5 VNF(B). Likewise, additional spare capacity from office 8 is used to restore office 5 VNF(A). In the example, APP(MC) in zone 3 is a mission critical app. In the example, despite additional capacity, the strategy did not allocate capacity from this app based on its priority.

Figure 2E:
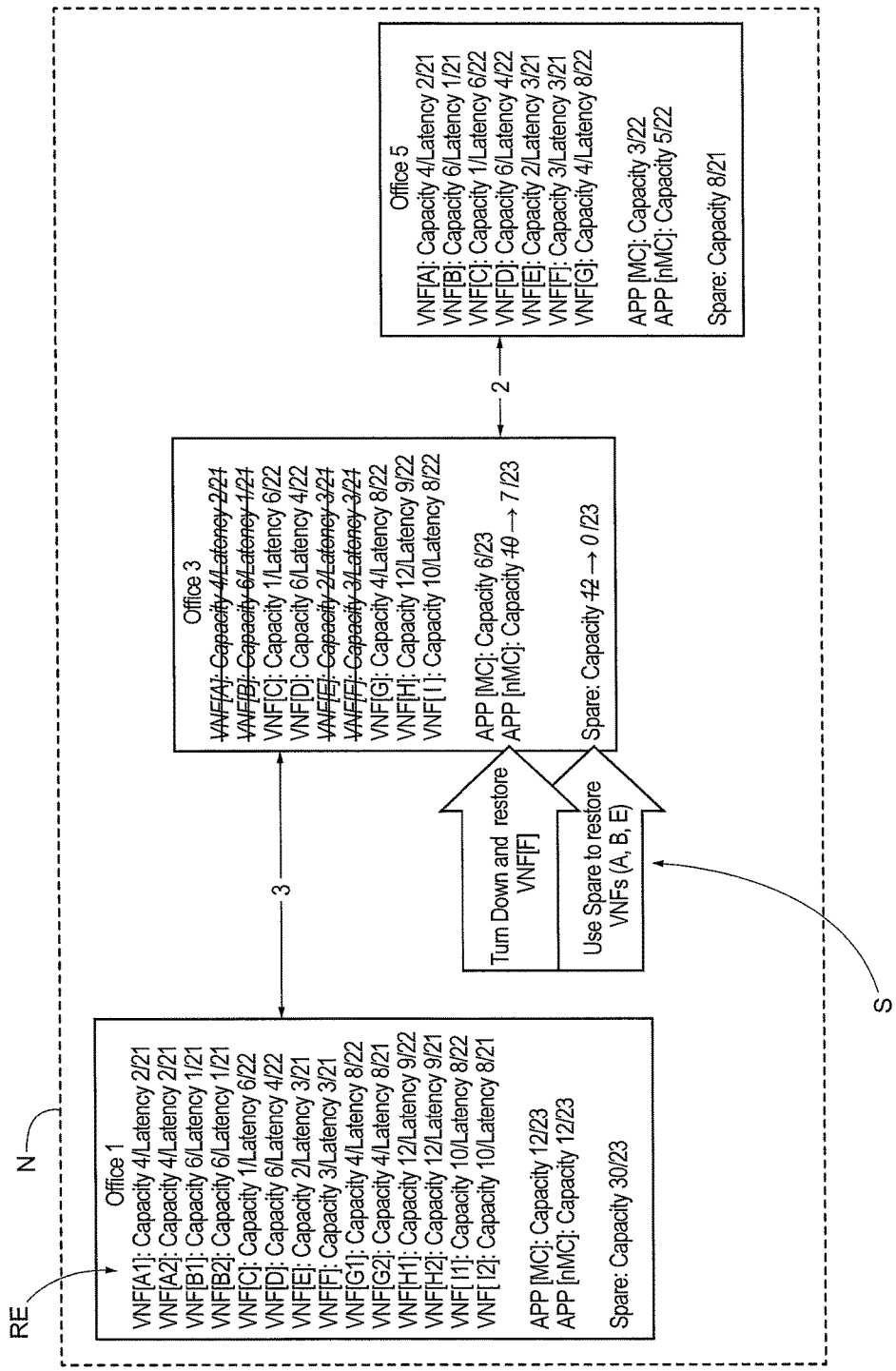
FIG. 2E is a schematic view similar to FIG. 2D depicting further operation of the system after another threat according to an example.

FIG. 2E provides an example of another type of threat. In this example, office 3 is a brick and mortar location. The threat is localized to the building for example, a loss of power or HVAC failure. As schematically shown, office 3 loses VNFs(A,B,E,F) assigned to zone 1. In this example, simulation engine's analysis of spare capacity shows that a strategy S using spare zone 3 resources can restore VNFs (A,B,E,F). The strategy S is fed to control engine and includes turning down 3 of 10 APP(nMC) in zone 3 to restore VNF(F). The zone 3 spare capacity in office 3 is used to restore the remaining VNFs(A,B,E). Control engine 232 sends commands to execution engine to trigger the utilization of zone 3 spares as provided in strategy S. Control engine 232 monitors the result of executing strategy S and reports back the actual result and implementation to machine learning engine 218.

Figure 3:
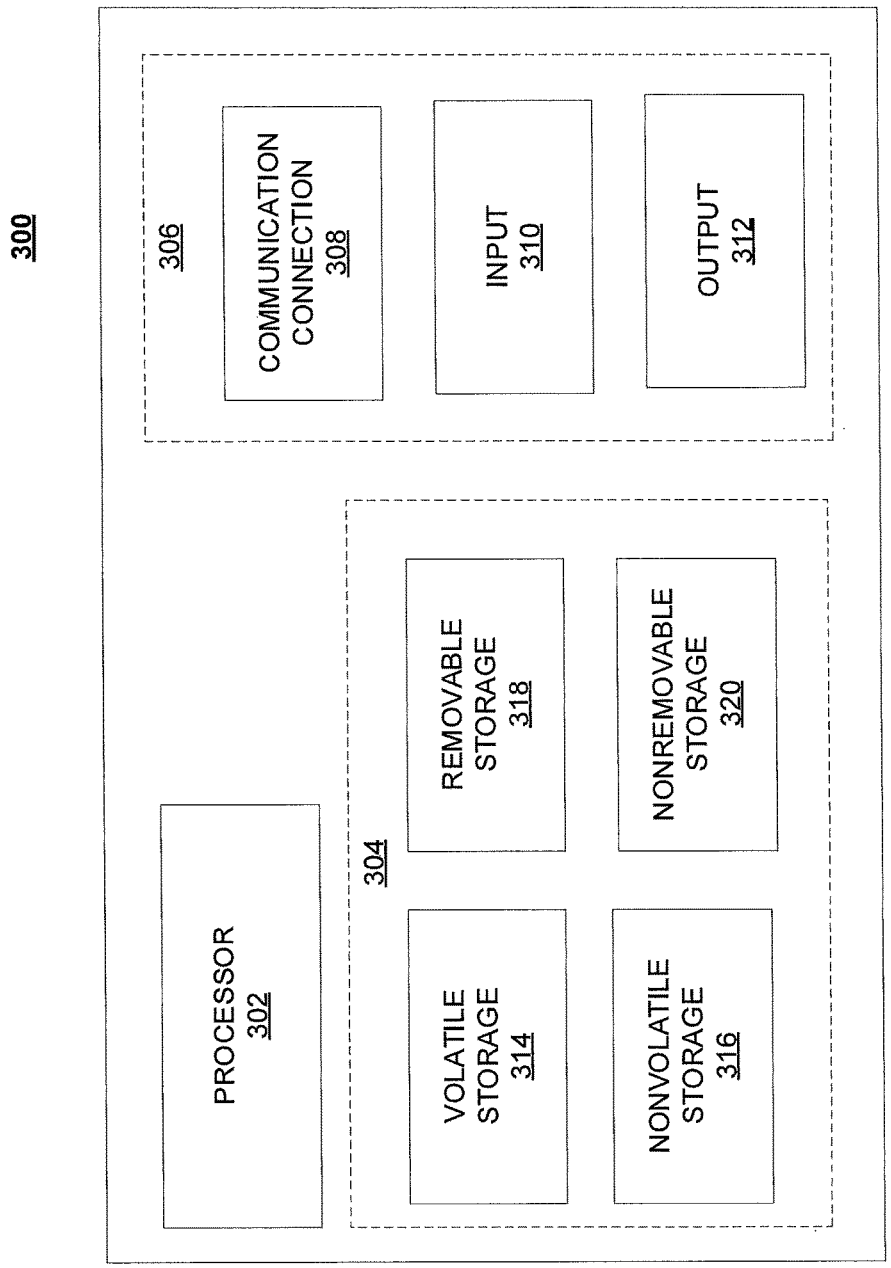
FIG. 3 is a representation of a network device according to an example.

System 200 may be implemented in a network device. FIG. 3 illustrates a functional block diagram depicting one example of a network device, generally indicated at 300. Network device 300 may comprise a processor 302 and a memory 304 coupled to processor 302. Memory 304 may contain executable instructions that, when executed by processor 302, cause processor 302 to effectuate operations associated with translating parallel protocols between end points in families as described above. As evident from the description herein, network device 300 is not to be construed as software per se.

In addition to processor 302 and memory 304, network device 300 may include an input/output system 306. Processor 302, memory 304, and input/output system 306 may be coupled together to allow communications between them. Each portion of network device 300 may comprise circuitry for performing functions associated with each respective portion. Thus, each portion may comprise hardware, or a combination of hardware and software. Accordingly, each portion of network device 300 is not to be construed as software per se. Input/output system 306 may be capable of receiving or providing information from or to a communications device or other network entities configured for telecommunications. For example input/output system 306 may include a wireless communications (e.g., 3G/4G/GPS) card. Input/output system 306 may be capable of receiving or sending video information, audio information, control information, image information, data, or any combination thereof. Input/output system 306 may be capable of transferring information with network device 300. In various configurations, input/output system 306 may receive or provide information via any appropriate means, such as, for example, optical means (e.g., infrared), electromagnetic means (e.g., RF, Wi-Fi, Bluetooth®, ZigBee®), acoustic means (e.g., speaker, microphone, ultrasonic receiver, ultrasonic transmitter), electrical means, or a combination thereof. In an example configuration, input/output system 306 may comprise a Wi-Fi finder, a two-way GPS chipset or equivalent, or the like, or a combination thereof. Bluetooth, infrared, NFC, and Zigbee are generally considered short range (e.g., few centimeters to 20 meters). WiFi is considered medium range (e.g., approximately 100 meters).

Input/output system 306 of network device 300 also may contain a communication connection 308 that allows network device 300 to communicate with other devices, network entities, or the like. Communication connection 308 may comprise communication media. Communication media typically embody computer-readable instructions, data structures, program modules or other data in a modulated data signal such as a carrier wave or other transport mechanism and includes any information delivery media. By way of example, and not limitation, communication media may include wired media such as a wired network or direct-wired connection, or wireless media such as acoustic, RF, infrared, or other wireless media. The term computer-readable media as used herein includes both storage media and communication media. Input/output system 306 also may include an input device 310 such as keyboard, mouse, pen, voice input device, or touch input device. Input/output system 306 may also include an output device 312, such as a display, speakers, or a printer.

Processor 302 may be capable of performing functions associated with telecommunications, such as functions for processing broadcast messages, as described herein. For example, processor 302 may be capable of, in conjunction with any other portion of network device 300, determining a potential threat, preparing a strategy to reallocate spare resources and/or expand a network by adding additional virtual network functions, as described herein. Processor 302 may also be programmed to perform simulations, and gamification to develop additional strategies. Processor 302 may further be programmed to perform machine learning to refine a strategy.

Memory 304 of network device 300 may comprise a storage medium having a concrete, tangible, physical structure. As is known, a signal does not have a concrete, tangible, physical structure. Memory 304, as well as any computer-readable storage medium described herein, is not to be construed as a signal. Memory 304, as well as any computer-readable storage medium described herein, is not to be construed as a transient signal. Memory 304, as well as any computer-readable storage medium described herein, is not to be construed as a propagating signal. Memory 304, as well as any computer-readable storage medium described herein, is to be construed as an article of manufacture.

Memory 304 may store any information utilized in conjunction with telecommunications. Depending upon the exact configuration or type of processor, memory 304 may include a volatile storage 314 (such as some types of RAM), a nonvolatile storage 316 (such as ROM, flash memory), or a combination thereof. Memory 304 may include additional storage (e.g., a removable storage 318 or a non-removable storage 320) including, for example, tape, flash memory, smart cards, CD-ROM, DVD, or other optical storage, magnetic cassettes, magnetic tape, magnetic disk storage or other magnetic storage devices, USB-compatible memory, or any other medium that can be used to store information and that can be accessed by network device 300. Memory 304 may comprise executable instructions that, when executed by processor 302, cause processor 302 to effectuate operations to map signal strengths in an area of interest.

A system for indirect BGP routing 200 may reside within any network to facilitate communication between edge routers from disparate network families and services. The following are example networks on which system 200 may reside. For purposes of centrality, system 200 may reside within a core network shown in the various examples below. However, it will be understood that system 200 may reside on any network edge router or network device providing the same function in connection with customer VRFs including but not limited to telecommunications networks, internet, and other networks described more completely below.

Figure 4:
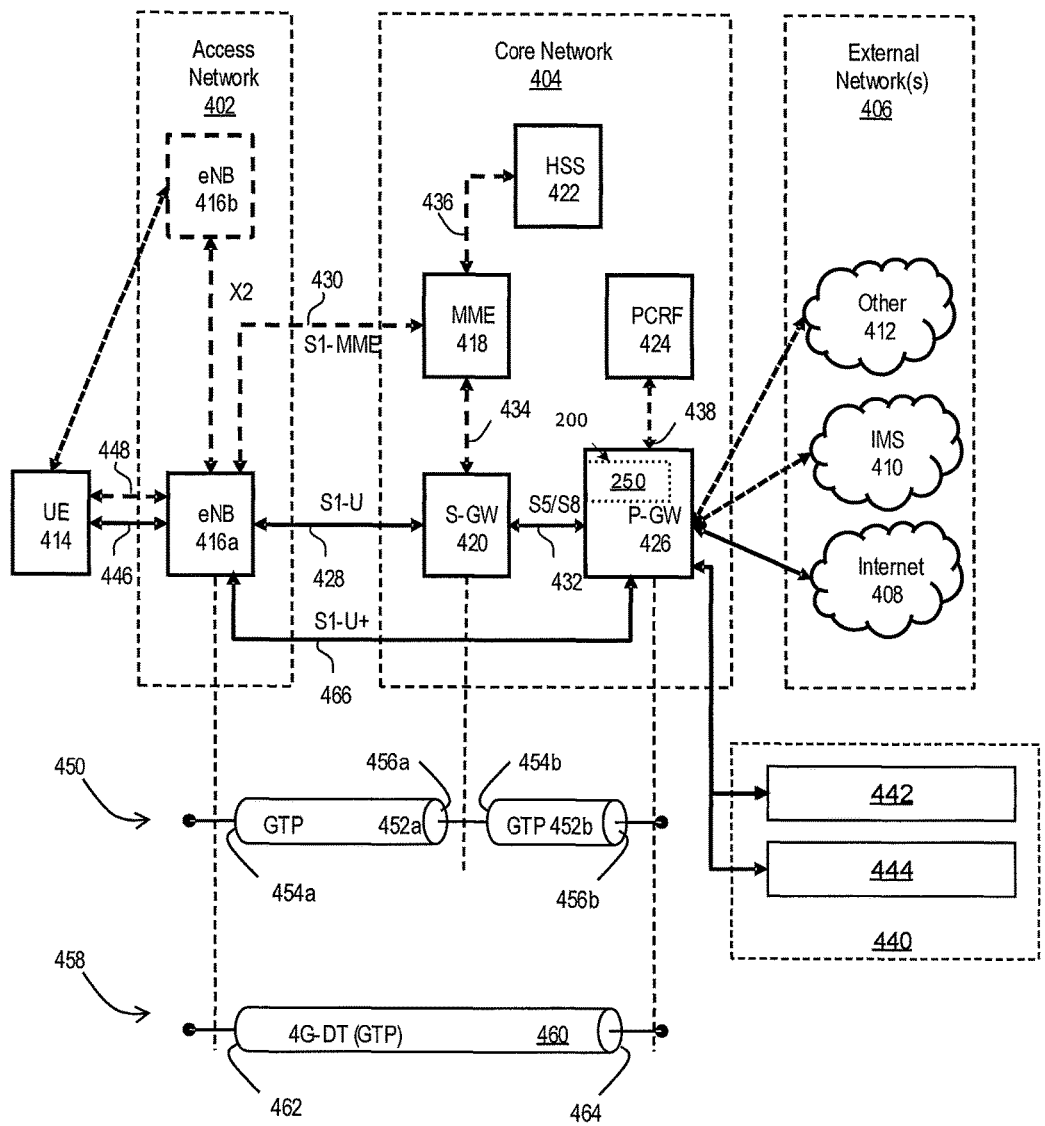
FIG. 4 depicts an exemplary communication system that provides wireless telecommunication services over wireless communication networks that may be at least partially implemented as an SDN.

FIG. 4 illustrates a functional block diagram depicting one example of an LTE-EPS network architecture 400 that may be at least partially implemented as an SDN. Network architecture 400 disclosed herein is referred to as a modified LTE-EPS architecture 400 to distinguish it from a traditional LTE-EPS architecture.

An example modified LTE-EPS architecture 400 is based at least in part on standards developed by the 3rd Generation Partnership Project (3GPP), with information available at www.3gpp.org. LTE-EPS network architecture 400 may include an access network 402, a core network 404, e.g., an EPC or Common BackBone (CBB) and one or more external networks 406, sometimes referred to as PDN or peer entities. Different external networks 406 can be distinguished from each other by a respective network identifier, e.g., a label according to DNS naming conventions describing an access point to the PDN. Such labels can be referred to as Access Point Names (APN). External networks 406 can include one or more trusted and non-trusted external networks such as an internet protocol (IP) network 408, an IP multimedia subsystem (IMS) network 410, and other networks 412, such as a service network, a corporate network, or the like. In an aspect, access network 402, core network 404, or external network 405 may include or communicate with network 100.

Access network 402 can include an LTE network architecture sometimes referred to as Evolved Universal mobile Telecommunication system Terrestrial Radio Access (E UTRA) and evolved UMTS Terrestrial Radio Access Network (E-UTRAN). Broadly, access network 402 can include one or more communication devices, commonly referred to as UE 414, and one or more wireless access nodes, or base stations 416a, 416b. During network operations, at least one base station 416 communicates directly with UE 414. Base station 416 can be an evolved Node B (e-NodeB), with which UE 414 communicates over the air and wirelessly. UEs 414 can include, without limitation, wireless devices, e.g., satellite communication systems, portable digital assistants (PDAs), laptop computers, tablet devices and other mobile devices (e.g., cellular telephones, smart appliances, and so on). UEs 414 can connect to eNBs 416 when UE 414 is within range according to a corresponding wireless communication technology.

UE 414 generally runs one or more applications that engage in a transfer of packets between UE 414 and one or more external networks 406. Such packet transfers can include one of downlink packet transfers from external network 406 to UE 414, uplink packet transfers from UE 414 to external network 406 or combinations of uplink and downlink packet transfers. Applications can include, without limitation, web browsing, VoIP, streaming media and the like. Each application can pose different Quality of Service (QoS) requirements on a respective packet transfer. Different packet transfers can be served by different bearers within core network 404, e.g., according to parameters, such as the QoS.

Core network 404 uses a concept of bearers, e.g., EPS bearers, to route packets, e.g., IP traffic, between a particular gateway in core network 404 and UE 414. A bearer refers generally to an IP packet flow with a defined QoS between the particular gateway and UE 414. Access network 402, e.g., E UTRAN, and core network 404 together set up and release bearers as required by the various applications. Bearers can be classified in at least two different categories: (i) minimum guaranteed bit rate bearers, e.g., for applications, such as VoIP; and (ii) non-guaranteed bit rate bearers that do not require guarantee bit rate, e.g., for applications, such as web browsing.

In one embodiment, the core network 404 includes various network entities, such as MME 418, SGW 420, Home Subscriber Server (HSS) 422, Policy and Charging Rules Function (PCRF) 424 and PGW 426. In one embodiment, MME 418 comprises a control node performing a control signaling between various equipment and devices in access network 402 and core network 404. The protocols running between UE 414 and core network 404 are generally known as Non-Access Stratum (NAS) protocols.

For illustration purposes only, the terms MME 418, SGW 420, HSS 422 and PGW 426, and so on, can be server devices, but may be referred to in the subject disclosure without the word "server." It is also understood that any form of such servers can operate in a device, system, component, or other form of centralized or distributed hardware and software. It is further noted that these terms and other terms such as bearer paths and/or interfaces are terms that can include features, methodologies, and/or fields that may be described in whole or in part by standards bodies such as the 3GPP. It is further noted that some or all embodiments of the subject disclosure may in whole or in part modify, supplement, or otherwise supersede final or proposed standards published and promulgated by 3GPP.

According to traditional implementations of LTE-EPS architectures, SGW 420 routes and forwards all user data packets. SGW 420 also acts as a mobility anchor for user plane operation during handovers between base stations, e.g., during a handover from first eNB 416a to second eNB 416b as may be the result of UE 414 moving from one area of coverage, e.g., cell, to another. SGW 420 can also terminate a downlink data path, e.g., from external network 406 to UE 414 in an idle state, and trigger a paging operation when downlink data arrives for UE 414. SGW 420 can also be configured to manage and store a context for UE 414, e.g., including one or more of parameters of the IP bearer service and network internal routing information. In addition, SGW 420 can perform administrative functions, e.g., in a visited network, such as collecting information for charging (e.g., the volume of data sent to or received from the user), and/or replicate user traffic, e.g., to support a lawful interception. SGW 420 also serves as the mobility anchor for interworking with other 3GPP technologies such as universal mobile telecommunication system (UMTS).

At any given time, UE 414 is generally in one of three different states: detached, idle, or active. The detached state is typically a transitory state in which UE 414 is powered on but is engaged in a process of searching and registering with network 402. In the active state, UE 414 is registered with access network 402 and has established a wireless connection, e.g., radio resource control (RRC) connection, with eNB 416. Whether UE 414 is in an active state can depend on the state of a packet data session, and whether there is an active packet data session. In the idle state, UE 414 is generally in a power conservation state in which UE 414 typically does not communicate packets. When UE 414 is idle, SGW 420 can terminate a downlink data path, e.g., from one peer entity 406, and triggers paging of UE 414 when data arrives for UE 414. If UE 414 responds to the page, SGW 420 can forward the IP packet to eNB 416*a*.

HSS 422 can manage subscription-related information for a user of UE 414. For example, tHSS 422 can store information such as authorization of the user, security requirements for the user, quality of service (QoS) requirements for the user, etc. HSS 422 can also hold information about external networks 406 to which the user can connect, e.g., in the form of an APN of external networks 406. For example, MME 418 can communicate with HSS 422 to determine if UE 414 is authorized to establish a call, e.g., a voice over IP (VoIP) call before the call is established.

PCRF 424 can perform QoS management functions and policy control. PCRF 424 is responsible for policy control decision-making, as well as for controlling the flow-based charging functionalities in a policy control enforcement function (PCEF), which resides in PGW 426. PCRF 424 provides the QoS authorization, e.g., QoS class identifier and bit rates that decide how a certain data flow will be treated in the PCEF and ensures that this is in accordance with the user's subscription profile.

PGW 426 can provide connectivity between the UE 414 and one or more of the external networks 406. In illustrative network architecture 400, PGW 426 can be responsible for IP address allocation for UE 414, as well as one or more of QoS enforcement and flow-based charging, e.g., according to rules from the PCRF 424. PGW 426 is also typically responsible for filtering downlink user IP packets into the different QoS-based bearers. In at least some embodiments, such filtering can be performed based on traffic flow templates. PGW 426 can also perform QoS enforcement, e.g., for guaranteed bit rate bearers. PGW 426 also serves as a mobility anchor for interworking with non-3GPP technologies such as CDMA2000.

Within access network 402 and core network 404 there may be various bearer paths/interfaces, e.g., represented by solid lines 428 and 430. Some of the bearer paths can be referred to by a specific label. For example, solid line 428 can be considered an S1-U bearer and solid line 432 can be considered an S5/S8 bearer according to LTE-EPS architecture standards. Without limitation, reference to various interfaces, such as S1, X2, S5, S8, S11 refer to EPS interfaces. In some instances, such interface designations are combined with a suffix, e.g., a "U" or a "C" to signify whether the interface relates to a "User plane" or a "Control plane." In addition, the core network 404 can include various signaling bearer paths/interfaces, e.g., control plane paths/interfaces represented by dashed lines 430, 434, 436, and 438. Some of the signaling bearer paths may be referred to by a specific label. For example, dashed line 430 can be considered as an S1-MME signaling bearer, dashed line 434 can be considered as an S11 signaling bearer and dashed line 436 can be considered as an S6a signaling bearer, e.g., according to LTE-EPS architecture standards. The above bearer paths and signaling bearer paths are only illustrated as examples and it should be noted that additional bearer paths and signaling bearer paths may exist that are not illustrated.

Also shown is a novel user plane path/interface, referred to as the S1-U+ interface 466. In the illustrative example, the S1-U+ user plane interface extends between the eNB 416*a* and PGW 426. Notably, S1-U+ path/interface does not include SGW 420, a node that is otherwise instrumental in configuring and/or managing packet forwarding between eNB 416*a* and one or more external networks 406 by way of PGW 426. As disclosed herein, the S1-U+ path/interface facilitates autonomous learning of peer transport layer addresses by one or more of the network nodes to facilitate a self-configuring of the packet forwarding path. In particular, such self-configuring can be accomplished during handovers in most scenarios so as to reduce any extra signaling load on the S/PGWs 420, 426 due to excessive handover events.

In some embodiments, PGW 426 is coupled to storage device 440, shown in phantom. Storage device 440 can be integral to one of the network nodes, such as PGW 426, for example, in the form of internal memory and/or disk drive. It is understood that storage device 440 can include registers suitable for storing address values. Alternatively or in addition, storage device 440 can be separate from PGW 426, for example, as an external hard drive, a flash drive, and/or network storage.

Storage device 440 selectively stores one or more values relevant to the forwarding of packet data. For example, storage device 440 can store identities and/or addresses of network entities, such as any of network nodes 418, 420, 422, 424, and 426, eNBs 416 and/or UE 414. In the illustrative example, storage device 440 includes a first storage location 442 and a second storage location 444. First storage location 442 can be dedicated to storing a Currently Used Downlink address value 442. Likewise, second storage location 444 can be dedicated to storing a Default Downlink Forwarding address value 444. PGW 426 can read and/or write values into either of storage locations 442, 444, for example, managing Currently Used Downlink Forwarding address value 442 and Default Downlink Forwarding address value 444 as disclosed herein.

In some embodiments, the Default Downlink Forwarding address for each EPS bearer is the SGW S5-U address for each EPS Bearer. The Currently Used Downlink Forwarding address" for each EPS bearer in PGW 426 can be set every time when PGW 426 receives an uplink packet, e.g., a GTP-U uplink packet, with a new source address for a corresponding EPS bearer. When UE 414 is in an idle state, the "Current Used Downlink Forwarding address" field for each EPS bearer of UE 414 can be set to a "null" or other suitable value.

In some embodiments, the Default Downlink Forwarding address is only updated when PGW 426 receives a new SGW S5-U address in a predetermined message or messages. For example, the Default Downlink Forwarding address is only updated when PGW 426 receives one of a Create Session Request, Modify Bearer Request and Create Bearer Response messages from SGW 420.

As values 442, 444 can be maintained and otherwise manipulated on a per bearer basis, it is understood that the storage locations can take the form of tables, spreadsheets, lists, and/or other data structures generally well understood and suitable for maintaining and/or otherwise manipulate forwarding addresses on a per bearer basis.

It should be noted that access network 402 and core network 404 are illustrated in a simplified block diagram in FIG. 4. In other words, either or both of access network 402 and the core network 404 can include additional network elements that are not shown, such as various routers, switches and controllers. In addition, although FIG. 4 illustrates only a single one of each of the various network elements, it should be noted that access network 402 and core network 404 can include any number of the various network elements. For example, core network 404 can include a pool (i.e., more than one) of MMEs 418, SGWs 420 or PGWs 426.

In the illustrative example, data traversing a network path between UE 414, eNB 416a, SGW 420, PGW 426 and external network 406 may be considered to constitute data transferred according to an end-to-end IP service. However, for the present disclosure, to properly perform establishment management in LTE-EPS network architecture 400, the core network, data bearer portion of the end-to-end IP service is analyzed.

An establishment may be defined herein as a connection set up request between any two elements within LTE-EPS network architecture 400. The connection set up request may be for user data or for signaling. A failed establishment may be defined as a connection set up request that was unsuccessful. A successful establishment may be defined as a connection set up request that was successful.

In one embodiment, a data bearer portion comprises a first portion (e.g., a data radio bearer 446) between UE 414 and eNB 416a, a second portion (e.g., an S1 data bearer 428) between eNB 416a and SGW 420, and a third portion (e.g., an S5/S8 bearer 432) between SGW 420 and PGW 426. Various signaling bearer portions are also illustrated in FIG. 4. For example, a first signaling portion (e.g., a signaling radio bearer 448) between UE 414 and eNB 416a, and a second signaling portion (e.g., S1 signaling bearer 430) between eNB 416a and MME 418.

In at least some embodiments, the data bearer can include tunneling, e.g., IP tunneling, by which data packets can be forwarded in an encapsulated manner, between tunnel endpoints. Tunnels, or tunnel connections can be identified in one or more nodes of network 100, e.g., by one or more of tunnel endpoint identifiers, an IP address and a user datagram protocol port number. Within a particular tunnel connection, payloads, e.g., packet data, which may or may not include protocol related information, are forwarded between tunnel endpoints.

An example of first tunnel solution 450 includes a first tunnel 452a between two tunnel endpoints 454a and 456a, and a second tunnel 452b between two tunnel endpoints 454b and 456b. In the illustrative example, first tunnel 452a is established between eNB 416a and SGW 420. Accordingly, first tunnel 452a includes a first tunnel endpoint 454a corresponding to an S1-U address of eNB 416a (referred to herein as the eNB S1-U address), and second tunnel endpoint 456a corresponding to an S1-U address of SGW 420 (referred to herein as the SGW S1-U address). Likewise, second tunnel 452b includes first tunnel endpoint 454b corresponding to an S5-U address of SGW 420 (referred to herein as the SGW S5-U address), and second tunnel endpoint 456b corresponding to an S5-U address of PGW 426 (referred to herein as the PGW S5-U address).

In at least some embodiments, first tunnel solution 450 is referred to as a two tunnel solution, e.g., according to the GPRS Tunneling Protocol User Plane (GTPv1-U based), as described in 3GPP specification TS 29.281, incorporated herein in its entirety. It is understood that one or more tunnels are permitted between each set of tunnel end points. For example, each subscriber can have one or more tunnels, e.g., one for each PDP context that they have active, as well as possibly having separate tunnels for specific connections with different quality of service requirements, and so on.

An example of second tunnel solution 458 includes a single or direct tunnel 460 between tunnel endpoints 462 and 464. In the illustrative example, direct tunnel 460 is established between eNB 416a and PGW 426, without subjecting packet transfers to processing related to SGW 420. Accordingly, direct tunnel 460 includes first tunnel endpoint 462 corresponding to the eNB S1-U address, and second tunnel endpoint 464 corresponding to the PGW S5-U address. Packet data received at either end can be encapsulated into a payload and directed to the corresponding address of the other end of the tunnel. Such direct tunneling avoids processing, e.g., by SGW 420 that would otherwise relay packets between the same two endpoints, e.g., according to a protocol, such as the GTP-U protocol.

In some scenarios, direct tunneling solution 458 can forward user plane data packets between eNB 416a and PGW 426, by way of SGW 420. That is, SGW 420 can serve a relay function, by relaying packets between two tunnel endpoints 416a, 426. In other scenarios, direct tunneling solution 458 can forward user data packets between eNB 416a and PGW 426, by way of the S1 U+ interface, thereby bypassing SGW 420.

Generally, UE 414 can have one or more bearers at any one time. The number and types of bearers can depend on applications, default requirements, and so on. It is understood that the techniques disclosed herein, including the configuration, management and use of various tunnel solutions 450, 458, can be applied to the bearers on an individual bases. That is, if user data packets of one bearer, say a bearer associated with a VoIP service of UE 414, then the forwarding of all packets of that bearer are handled in a similar manner Continuing with this example, the same UE 414 can have another bearer associated with it through the same eNB 416a. This other bearer, for example, can be associated with a relatively low rate data session forwarding user data packets through core network 404 simultaneously with the first bearer. Likewise, the user data packets of the other bearer are also handled in a similar manner, without necessarily following a forwarding path or solution of the first bearer. Thus, one of the bearers may be forwarded through direct tunnel 458; whereas, another one of the bearers may be forwarded through a two-tunnel solution 450.

Figure 5:
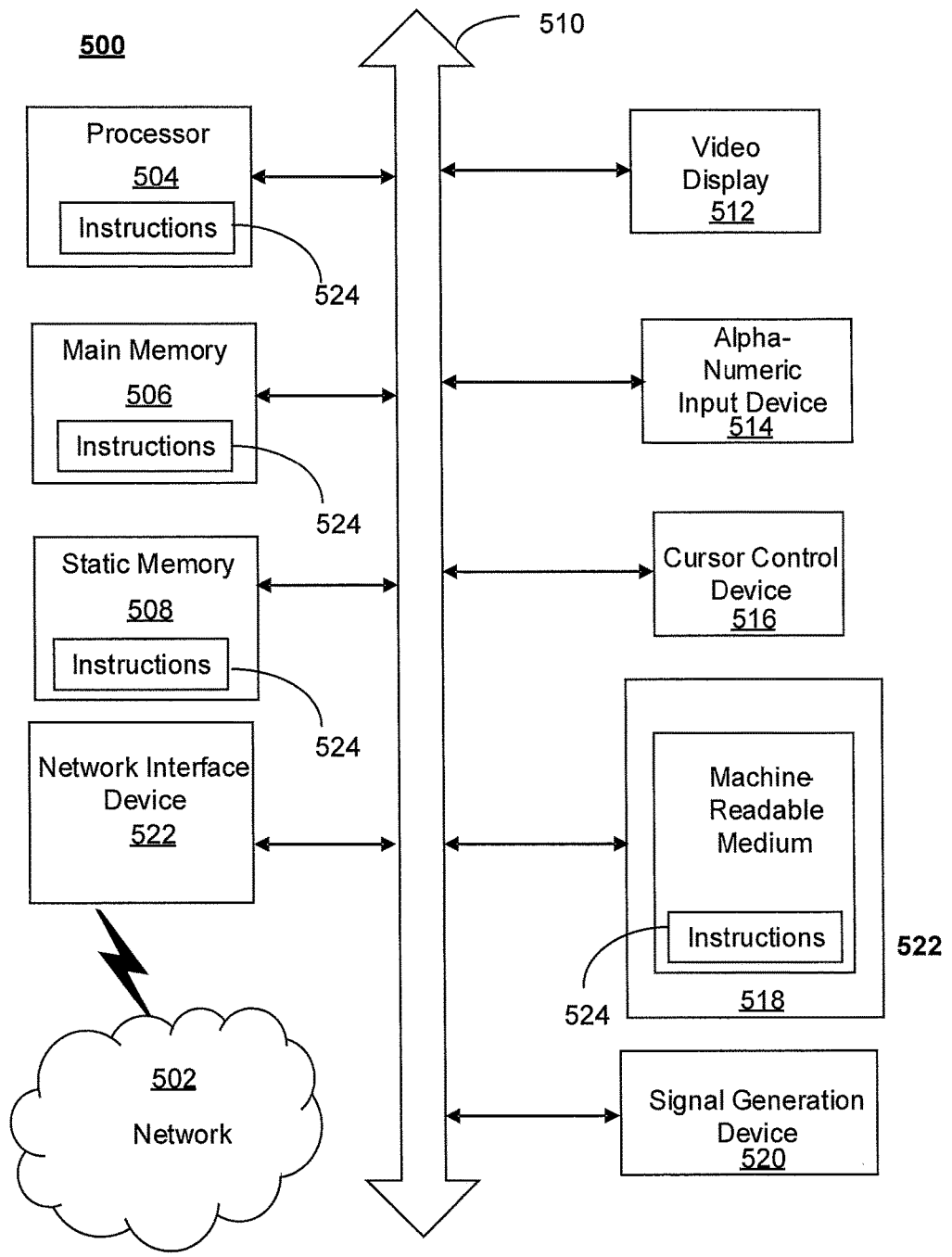
FIG. 5 depicts an exemplary diagrammatic representation of a machine in the form of a computer system.

FIG. 5 depicts an exemplary diagrammatic representation of a machine in the form of a computer system 500 within which a set of instructions, when executed, may cause the machine to perform any one or more of the methods described above. One or more instances of the machine can operate, for example, as processor 302, UE 414, eNB 416, MME 418, SGW 420, HSS 422, PCRF 424, PGW 426 and other devices of FIGS. 1, 2, and 4. In some embodiments, the machine may be connected (e.g., using a network 502) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

Computer system 500 may include a processor (or controller) 504 (e.g., a central processing unit (CPU)), a graphics processing unit (GPU, or both), a main memory 506 and a static memory 508, which communicate with each other via a bus 510. The computer system 500 may further include a display unit 512 (e.g., a liquid crystal display (LCD), a flat panel, or a solid state display). Computer system 500 may include an input device 514 (e.g., a keyboard), a cursor control device 516 (e.g., a mouse), a disk drive unit 518, a signal generation device 520 (e.g., a speaker or remote control) and a network interface device 522. In distributed environments, the embodiments described in the subject disclosure can be adapted to utilize multiple display units 512 controlled by two or more computer systems 500. In this configuration, presentations described by the subject disclosure may in part be shown in a first of display units 512, while the remaining portion is presented in a second of display units 512.

The disk drive unit 518 may include a tangible computer-readable storage medium 524 on which is stored one or more sets of instructions (e.g., software 526) embodying any one or more of the methods or functions described herein, including those methods illustrated above. Instructions 526 may also reside, completely or at least partially, within main memory 506, static memory 508, or within processor 504 during execution thereof by the computer system 500. Main memory 506 and processor 504 also may constitute tangible computer-readable storage media.

Figure 6:
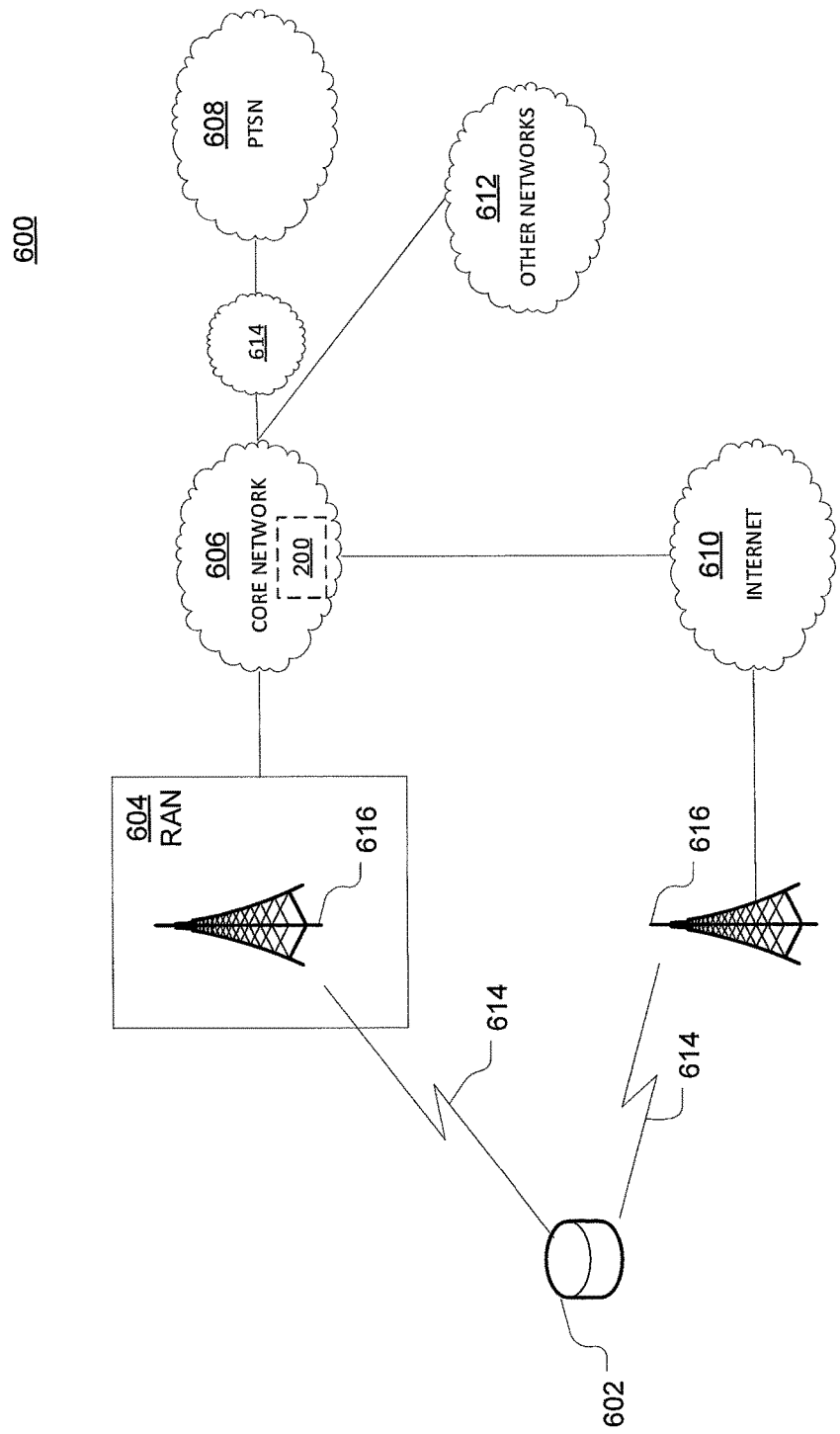
FIG. 6 is a representation of a telecommunications network.

As shown in FIG. 6, telecommunication system 600 may include wireless transmit/receive units (WTRUs) 602, a RAN 604, a core network 606, a public switched telephone network (PSTN) 608, the Internet 610, or other networks 612, though it will be appreciated that the disclosed examples contemplate any number of WTRUs, base stations, networks, or network elements. Each WTRU 602 may be any type of device configured to operate or communicate in a wireless environment. For example, a WTRU may comprise drone 102, a mobile device, network device 300, or the like, or any combination thereof. By way of example, WTRUs 602 may be configured to transmit or receive wireless signals and may include a UE, a mobile station, a mobile device, a fixed or mobile subscriber unit, a pager, a cellular telephone, a PDA, a smartphone, a laptop, a netbook, a personal computer, a wireless sensor, consumer electronics, or the like. WTRUs 602 may be configured to transmit or receive wireless signals over an air interface 614.

Telecommunication system 600 may also include one or more base stations 616. Each of base stations 616 may be any type of device configured to wirelessly interface with at least one of the WTRUs 602 to facilitate access to one or more communication networks, such as core network 606, PTSN 608, Internet 610, or other networks 612. By way of example, base stations 616 may be a base transceiver station (BTS), a Node-B, an eNode B, a Home Node B, a Home eNode B, a site controller, an access point (AP), a wireless router, or the like. While base stations 616 are each depicted as a single element, it will be appreciated that base stations 616 may include any number of interconnected base stations or network elements.

RAN 604 may include one or more base stations 616, along with other network elements, such as a base station controller (BSC), a radio network controller (RNC), or relay nodes. One or more base stations 616 may be configured to transmit or receive wireless signals within a particular geographic region, which may be referred to as a cell. The cell may further be divided into cell sectors. For example, the cell associated with base station 616 may be divided into three sectors such that base station 616 may include three transceivers: one for each sector of the cell. In another example, base station 616 may employ multiple-input multiple-output (MIMO) technology and, therefore, may utilize multiple transceivers for each sector of the cell.

Base stations 616 may communicate with one or more of WTRUs 602 over air interface 614, which may be any suitable wireless communication link (e.g., RF, microwave, infrared (IR), ultraviolet (UV), or visible light). Air interface 614 may be established using any suitable radio access technology (RAT).

More specifically, as noted above, telecommunication system 600 may be a multiple access system and may employ one or more channel access schemes, such as CDMA, TDMA, FDMA, OFDMA, SC-FDMA, or the like. For example, base station 616 in RAN 604 and WTRUs 602 connected to RAN 604 may implement a radio technology such as Universal Mobile Telecommunications System (UMTS) Terrestrial Radio Access (UTRA) that may establish air interface 614 using wideband CDMA (WCDMA). WCDMA may include communication protocols, such as High-Speed Packet Access (HSPA) or Evolved HSPA (HSPA+). HSPA may include High-Speed Downlink Packet Access (HSDPA) or High-Speed Uplink Packet Access (HSUPA).

As another example base station 616 and WTRUs 602 that are connected to RAN 604 may implement a radio technology such as Evolved UMTS Terrestrial Radio Access (E-UTRA), which may establish air interface 614 using LTE or LTE-Advanced (LTE-A).

Optionally base station 616 and WTRUs 602 connected to RAN 604 may implement radio technologies such as IEEE 602.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), GSM, Enhanced Data rates for GSM Evolution (EDGE), GSM EDGE (GERAN), or the like.

Base station 616 may be a wireless router, Home Node B, Home eNode B, or access point, for example, and may utilize any suitable RAT for facilitating wireless connectivity in a localized area, such as a place of business, a home, a vehicle, a campus, or the like. For example, base station 616 and associated WTRUs 602 may implement a radio technology such as IEEE 602.11 to establish a wireless local area network (WLAN). As another example, base station 616 and associated WTRUs 602 may implement a radio technology such as IEEE 602.15 to establish a wireless personal area network (WPAN). In yet another example, base station 616 and associated WTRUs 602 may utilize a cellular-based RAT (e.g., WCDMA, CDMA2000, GSM, LTE, LTE-A, etc.) to establish a picocell or femtocell. As shown in FIG. 6, base station 616 may have a direct connection to Internet 610. Thus, base station 616 may not be required to access Internet 610 via core network 606.

RAN 604 may be in communication with core network 606, which may be any type of network configured to provide voice, data, applications, and/or voice over internet protocol (VoIP) services to one or more WTRUs 602. For example, core network 606 may provide call control, billing services, mobile location-based services, pre-paid calling, Internet connectivity, video distribution or high-level security functions, such as user authentication. Although not shown in FIG. 6, it will be appreciated that RAN 604 or core network 606 may be in direct or indirect communication with other RANs that employ the same RAT as RAN 604 or a different RAT. For example, in addition to being connected to RAN 604, which may be utilizing an E-UTRA radio technology, core network 606 may also be in communication with another RAN employing a GSM radio technology.

Core network 606 may also serve as a gateway for WTRUs 602 to access PSTN 608, Internet 610, or other networks 612. PSTN 608 may include circuit-switched telephone networks that provide plain old telephone service (POTS). For LTE core networks, core network 606 may use IMS core 614 to provide access to PSTN 608. Internet 610 may include a global system of interconnected computer networks or devices that use common communication protocols, such as the transmission control protocol (TCP), user datagram protocol (UDP), or IP in the TCP/IP internet protocol suite. Other networks 612 may include wired or wireless communications networks owned or operated by other service providers. For example, other networks 612 may include another core network connected to one or more RANs, which may employ the same RAT as RAN 604 or a different RAT.

Some or all WTRUs 602 in telecommunication system 600 may include multi-mode capabilities. That is, WTRUs 602 may include multiple transceivers for communicating with different wireless networks over different wireless links. For example, one or more WTRUs 602 may be configured to communicate with base station 616, which may employ a cellular-based radio technology, and with base station 616, which may employ an IEEE 802 radio technology.

Figure 7:
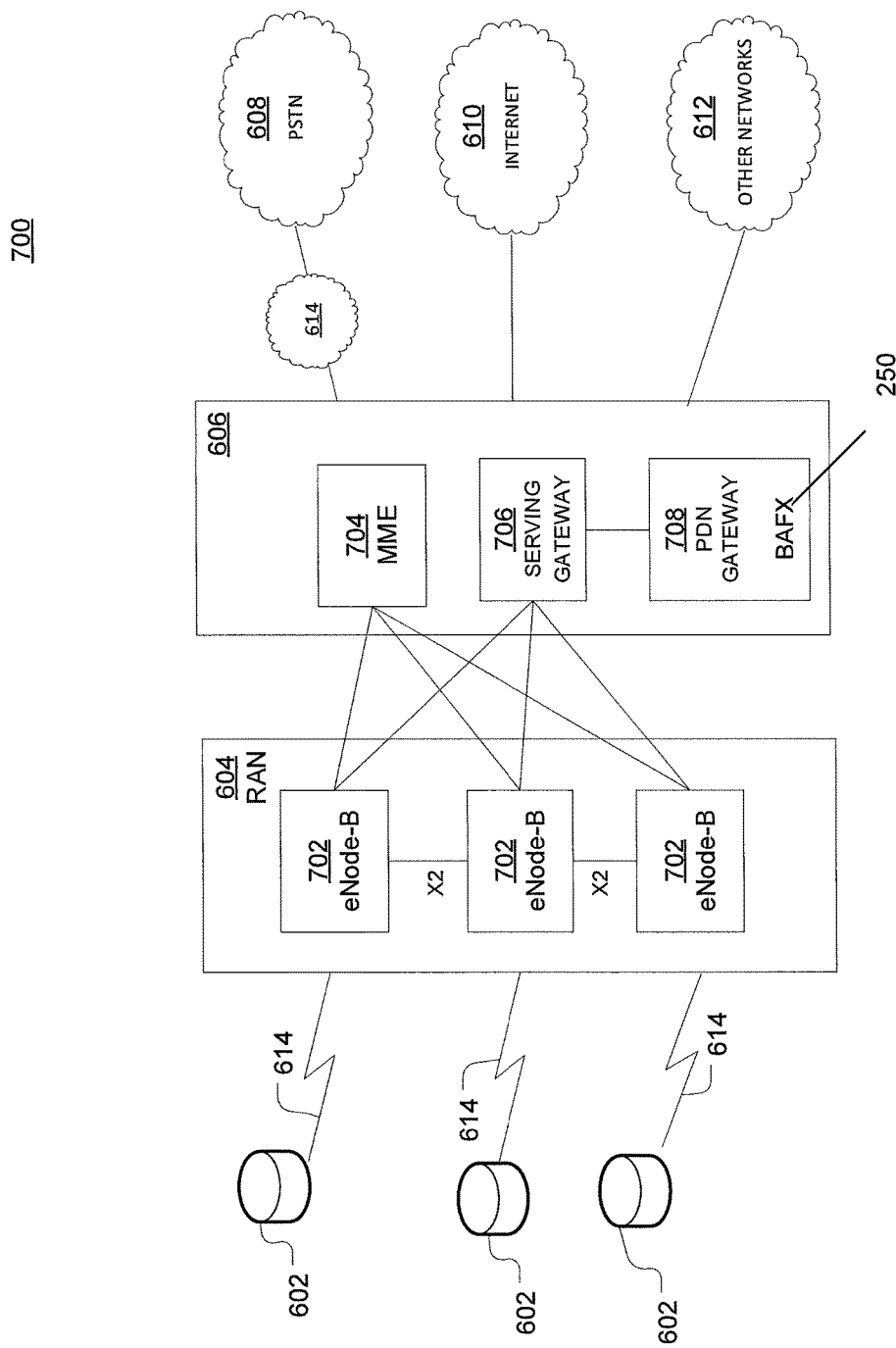
FIG. 7 is a representation of a core network.

FIG. 7 is an example system 700 including RAN 604 and core network 606. As noted above, RAN 604 may employ an E-UTRA radio technology to communicate with WTRUs 602 over air interface 614. RAN 604 may also be in communication with core network 606.

RAN 604 may include any number of eNode-Bs 702 while remaining consistent with the disclosed technology. One or more eNode-Bs 702 may include one or more transceivers for communicating with the WTRUs 602 over air interface 614. Optionally, eNode-Bs 702 may implement MIMO technology. Thus, one of eNode-Bs 702, for example, may use multiple antennas to transmit wireless signals to, or receive wireless signals from, one of WTRUs 602.

Each of eNode-Bs 702 may be associated with a particular cell and may be configured to handle radio resource management decisions, handover decisions, scheduling of users in the uplink or downlink, or the like. As shown in FIG. 7 eNode-Bs 702 may communicate with one another over an X2 interface.

Core network 606 shown in FIG. 7 may include a mobility management gateway or entity (MME) 704, a serving gateway 706, or a packet data network (PDN) gateway 708. While each of the foregoing elements are depicted as part of core network 606, it will be appreciated that any one of these elements may be owned or operated by an entity other than the core network operator.

MME 704 may be connected to each of eNode-Bs 702 in RAN 604 via an S1 interface and may serve as a control node. For example, MME 704 may be responsible for authenticating users of WTRUs 602, bearer activation or deactivation, selecting a particular serving gateway during an initial attach of WTRUs 602, or the like. MME 704 may also provide a control plane function for switching between RAN 604 and other RANs that employ other radio technologies, such as GSM or WCDMA.

Serving gateway 706 may be connected to each of eNode-Bs 702 in RAN 604 via the S1 interface. Serving gateway 706 may generally route or forward user data packets to or from the WTRUs 602. Serving gateway 706 may also perform other functions, such as anchoring user planes during inter-eNode B handovers, triggering paging when downlink data is available for WTRUs 602, managing or storing contexts of WTRUs 602, or the like.

Serving gateway 706 may also be connected to PDN gateway 708, which may provide WTRUs 602 with access to packet-switched networks, such as Internet 610, to facilitate communications between WTRUs 602 and IP-enabled devices.

Core network 606 may facilitate communications with other networks. For example, core network 606 may provide WTRUs 602 with access to circuit-switched networks, such as PSTN 608, such as through IMS core 614, to facilitate communications between WTRUs 602 and traditional landline communications devices. In addition, core network 606 may provide the WTRUs 602 with access to other networks 612, which may include other wired or wireless networks that are owned or operated by other service providers.

Figure 8:
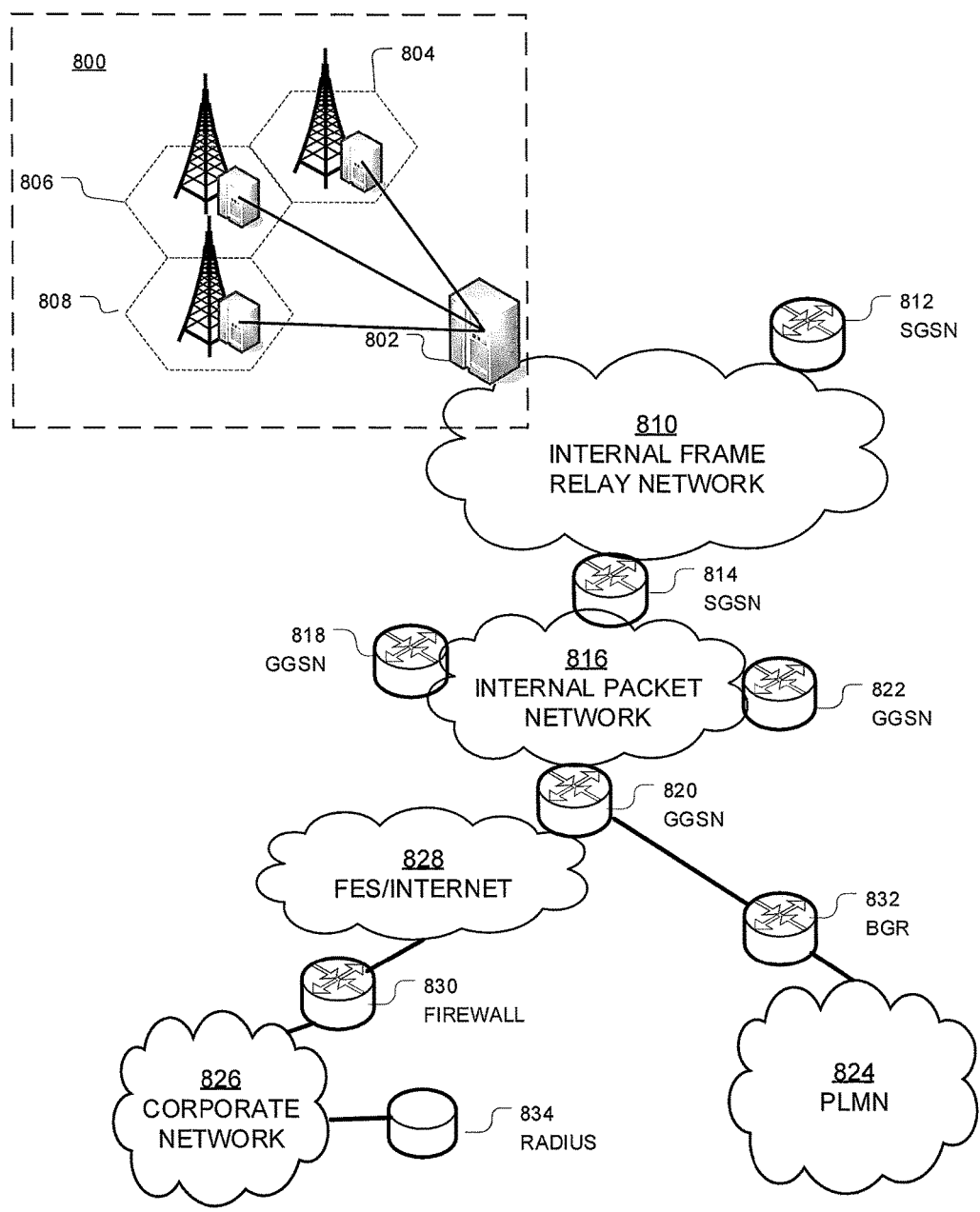
FIG. 8 is a representation packet-based mobile cellular network environment.

FIG. 8 depicts an overall block diagram of an example packet-based mobile cellular network environment, such as a GPRS network as described herein. In the example packet-based mobile cellular network environment shown in FIG. 8, there are a plurality of base station subsystems (BSS) 800 (only one is shown), each of which comprises a base station controller (BSC) 802 serving a plurality of BTSs, such as BTSs 804, 806, 808. BTSs 804, 806, 808 are the access points where users of packet-based mobile devices become connected to the wireless network. In example fashion, the packet traffic originating from mobile devices is transported via an over-the-air interface to BTS 808, and from BTS 808 to BSC 802. Base station subsystems, such as BSS 800, are a part of internal frame relay network 810 that can include a service GPRS support nodes (SGSN), such as SGSN 812 or SGSN 814. Each SGSN 812, 814 is connected to an internal packet network 816 through which SGSN 812, 814 can route data packets to or from a plurality of gateway GPRS support nodes (GGSN) 818, 820, 822. As illustrated, SGSN 814 and GGSNs 818, 820, 822 are part of internal packet network 816. GGSNs 818, 820, 822 mainly provide an interface to external IP networks such as PLMN 824, corporate intranets/internets 826, or Fixed-End System (FES) or the public Internet 828. As illustrated, subscriber corporate network 826 may be connected to GGSN 820 via a firewall 830. PLMN 824 may be connected to GGSN 820 via a border gateway router (BGR) 832. A Remote Authentication Dial-In User Service (RADIUS) server 834 may be used for caller authentication when a user calls corporate network 826.

Generally, there may be a several cell sizes in a network, referred to as macro, micro, pico, femto or umbrella cells. The coverage area of each cell is different in different environments. Macro cells can be regarded as cells in which the base station antenna is installed in a mast or a building above average roof top level. Micro cells are cells whose antenna height is under average roof top level. Micro cells are typically used in urban areas. Pico cells are small cells having a diameter of a few dozen meters. Pico cells are used mainly indoors. Femto cells have the same size as pico cells, but a smaller transport capacity. Femto cells are used indoors, in residential or small business environments. On the other hand, umbrella cells are used to cover shadowed regions of smaller cells and fill in gaps in coverage between those cells.

Figure 9:
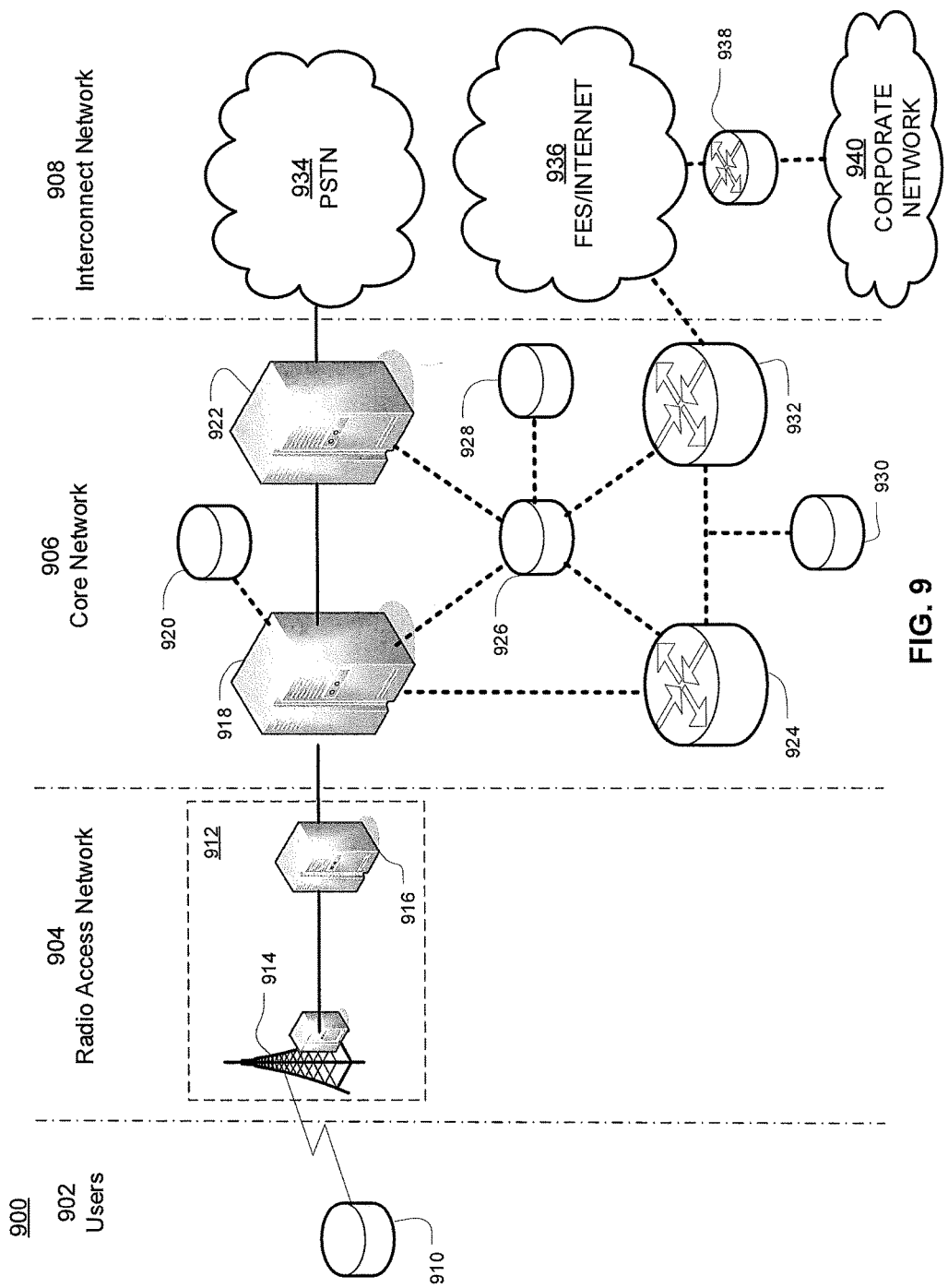
FIG. 9 is a representation of a GPRS network.

FIG. 9 illustrates an architecture of a typical GPRS network 900 as described herein. The architecture depicted in FIG. 9 may be segmented into four groups: users 902, RAN 904, core network 906, and interconnect network 908. Users 902 comprise a plurality of end users, who each may use one or more devices 910. Note that device 910 is referred to as a mobile subscriber (MS) in the description of network shown in FIG. 9. In an example, device 910 comprises a communications device (e.g., mobile device 102, mobile positioning center 116, network device 300, any of detected devices 500, second device 508, access device 604, access device 606, access device 608, access device 610 or the like, or any combination thereof). Radio access network 904 comprises a plurality of BSSs such as BSS 912, which includes a BTS 914 and a BSC 916. Core network 906 may include a host of various network elements. As illustrated in FIG. 9, core network 906 may comprise MSC 918, service control point (SCP) 920, gateway MSC (GMSC) 922, SGSN 924, home location register (HLR) 926, authentication center (AuC) 928, domain name system (DNS) server 930, and GGSN 932. Interconnect network 908 may also comprise a host of various networks or other network elements. As illustrated in FIG. 9, interconnect network 908 comprises a PSTN 934, an FES/Internet 936, a firewall 1038 (FIG. 10), or a corporate network 940.

An MSC can be connected to a large number of BSCs. At MSC 918, for instance, depending on the type of traffic, the traffic may be separated in that voice may be sent to PSTN 934 through GMSC 922, or data may be sent to SGSN 924, which then sends the data traffic to GGSN 932 for further forwarding.

When MSC 918 receives call traffic, for example, from BSC 916, it sends a query to a database hosted by SCP 920, which processes the request and issues a response to MSC 918 so that it may continue call processing as appropriate.

HLR 926 is a centralized database for users to register to the GPRS network. HLR 926 stores static information about the subscribers such as the International Mobile Subscriber Identity (IMSI), subscribed services, or a key for authenticating the subscriber. HLR 926 also stores dynamic subscriber information such as the current location of the MS. Associated with HLR 926 is AuC 928, which is a database that contains the algorithms for authenticating subscribers and includes the associated keys for encryption to safeguard the user input for authentication.

In the following, depending on context, "mobile subscriber" or "MS" sometimes refers to the end user and sometimes to the actual portable device, such as a mobile device, used by an end user of the mobile cellular service. When a mobile subscriber turns on his or her mobile device, the mobile device goes through an attach process by which the mobile device attaches to an SGSN of the GPRS network. In FIG. 9, when MS 910 initiates the attach process by turning on the network capabilities of the mobile device, an attach request is sent by MS 910 to SGSN 924. The SGSN 924 queries another SGSN, to which MS 910 was attached before, for the identity of MS 910. Upon receiving the identity of MS 910 from the other SGSN, SGSN 924 requests more information from MS 910. This information is used to authenticate MS 910 together with the information provided by HLR 926. Once verified, SGSN 924 sends a location update to HLR 926 indicating the change of location to a new SGSN, in this case SGSN 924. HLR 926 notifies the old SGSN, to which MS 910 was attached before, to cancel the location process for MS 910. HLR 926 then notifies SGSN 924 that the location update has been performed. At this time, SGSN 924 sends an Attach Accept message to MS 910, which in turn sends an Attach Complete message to SGSN 924.

Next, MS 910 establishes a user session with the destination network, corporate network 940, by going through a Packet Data Protocol (PDP) activation process. Briefly, in the process, MS 910 requests access to the Access Point Name (APN), for example, UPS.com, and SGSN 924 receives the activation request from MS 910. SGSN 924 then initiates a DNS query to learn which GGSN 932 has access to the UPS.com APN. The DNS query is sent to a DNS server within core network 906, such as DNS server 930, which is provisioned to map to one or more GGSNs in core network 906. Based on the APN, the mapped GGSN 932 can access requested corporate network 940. SGSN 924 then sends to GGSN 932 a Create PDP Context Request message that contains necessary information. GGSN 932 sends a Create PDP Context Response message to SGSN 924, which then sends an Activate PDP Context Accept message to MS 910.

Once activated, data packets of the call made by MS 910 can then go through RAN 904, core network 906, and interconnect network 908, in a particular FES/Internet 936 and firewall 1038, to reach corporate network 940.

Figure 10:
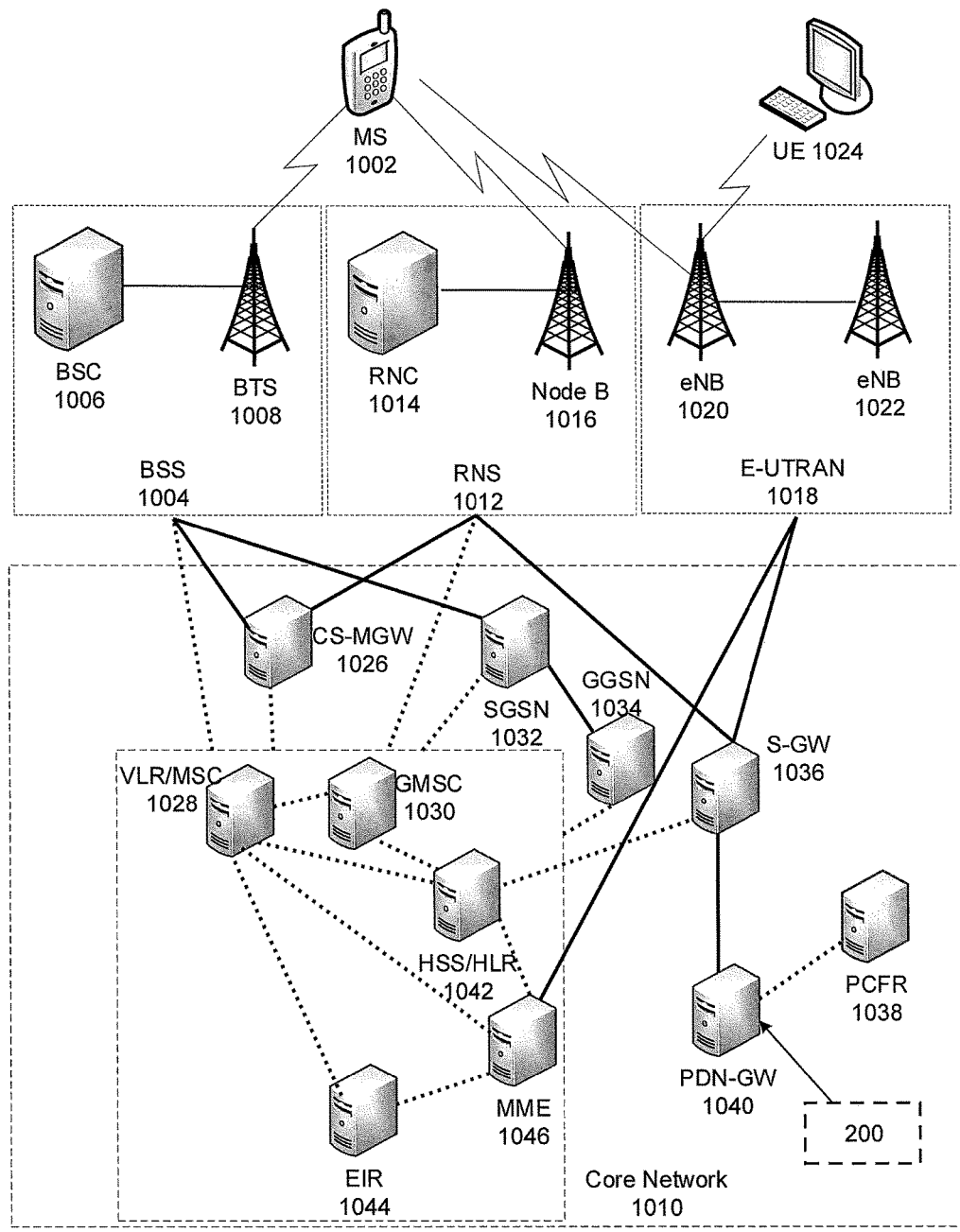
FIG. 10 is a representation a PLMN architecture.

FIG. 10 illustrates a block diagram of an example PLMN architecture that may be replaced by a telecommunications system. In FIG. 10, solid lines may represent user traffic signals, and dashed lines may represent support signaling. MS 1002 is the physical equipment used by the PLMN subscriber. For example, drone 102, network device 300, the like, or any combination thereof may serve as MS 1002. MS 1002 may be one of, but not limited to, a cellular telephone, a cellular telephone in combination with another electronic device or any other wireless mobile communication device.

MS 1002 may communicate wirelessly with BSS 1004. BSS 1004 contains BSC 1006 and a BTS 1008. BSS 1004 may include a single BSC 1006/BTS 1008 pair (base station) or a system of BSC/BTS pairs that are part of a larger network. BSS 1004 is responsible for communicating with MS 1002 and may support one or more cells. BSS 1004 is responsible for handling cellular traffic and signaling between MS 1002 and a core network 1010. Typically, BSS 1004 performs functions that include, but are not limited to, digital conversion of speech channels, allocation of channels to mobile devices, paging, or transmission/reception of cellular signals.

Additionally, MS 1002 may communicate wirelessly with RNS 1012. RNS 1012 contains a Radio Network Controller (RNC) 1014 and one or more Nodes B 1016. RNS 1012 may support one or more cells. RNS 1012 may also include one or more RNC 1014/Node B 1016 pairs or alternatively a single RNC 1014 may manage multiple Nodes B 1016. RNS 1012 is responsible for communicating with MS 1002 in its geographically defined area. RNC 1014 is responsible for controlling Nodes B 1016 that are connected to it and is a control element in a UMTS radio access network. RNC 1014 performs functions such as, but not limited to, load control, packet scheduling, handover control, security functions, or controlling MS 1002 access to core network 1010.

An E-UTRA Network (E-UTRAN) 1018 is a RAN that provides wireless data communications for MS 1002 and UE 1024. E-UTRAN 1018 provides higher data rates than traditional UMTS. It is part of the LTE upgrade for mobile networks, and later releases meet the requirements of the International Mobile Telecommunications (IMT) Advanced and are commonly known as a 4G networks. E-UTRAN 1018 may include of series of logical network components such as E-UTRAN Node B (eNB) 1020 and E-UTRAN Node B (eNB) 1022. E-UTRAN 1018 may contain one or more eNBs. User equipment (UE) 1024 may be any mobile device capable of connecting to E-UTRAN 1018 including, but not limited to, a personal computer, laptop, mobile device, wireless router, or other device capable of wireless connectivity to E-UTRAN 1018. The improved performance of the E-UTRAN 1018 relative to a typical UMTS network allows for increased bandwidth, spectral efficiency, and functionality including, but not limited to, voice, high-speed applications, large data transfer or IPTV, while still allowing for full mobility.

Typically MS 1002 may communicate with any or all of BSS 1004, RNS 1012, or E-UTRAN 1018. In a illustrative system, each of BSS 1004, RNS 1012, and E-UTRAN 1018 may provide MS 1002 with access to core network 1010. Core network 1010 may include of a series of devices that route data and communications between end users. Core network 1010 may provide network service functions to users in the circuit switched (CS) domain or the packet switched (PS) domain. The CS domain refers to connections in which dedicated network resources are allocated at the time of connection establishment and then released when the connection is terminated. The PS domain refers to communications and data transfers that make use of autonomous groupings of bits called packets. Each packet may be routed, manipulated, processed or handled independently of all other packets in the PS domain and does not require dedicated network resources.

The circuit-switched MGW function (CS-MGW) 1026 is part of core network 1010, and interacts with VLR/MSC server 1028 and GMSC server 1030 in order to facilitate core network 1010 resource control in the CS domain. Functions of CS-MGW 1026 include, but are not limited to, media conversion, bearer control, payload processing or other mobile network processing such as handover or anchoring. CS-MGW 1026 may receive connections to MS 1002 through BSS 1004 or RNS 1012.

SGSN 1032 stores subscriber data regarding MS 1002 in order to facilitate network functionality. SGSN 1032 may store subscription information such as, but not limited to, the IMSI, temporary identities, or PDP addresses. SGSN 1032 may also store location information such as, but not limited to, GGSN address for each GGSN 1034 where an active PDP exists. GGSN 1034 may implement a location register function to store subscriber data it receives from SGSN 1032 such as subscription or location information.

Serving gateway (S-GW) 1036 is an interface which provides connectivity between E-UTRAN 1018 and core network 1010. Functions of S-GW 1036 include, but are not limited to, packet routing, packet forwarding, transport level packet processing, or user plane mobility anchoring for inter-network mobility. PCRF 1038 uses information gathered from P-GW 1036, as well as other sources, to make applicable policy and charging decisions related to data flows, network resources or other network administration functions. PDN gateway (PDN-GW) 1040 may provide user-to-services connectivity functionality including, but not limited to, GPRS/EPC network anchoring, bearer session anchoring and control, or IP address allocation for PS domain connections.

HSS 1042 is a database for user information and stores subscription data regarding MS 1002 or UE 1024 for handling calls or data sessions. Networks may contain one HSS 1042 or more if additional resources are required. Example data stored by HSS 1042 include, but is not limited to, user identification, numbering or addressing information, security information, or location information. HSS 1042 may also provide call or session establishment procedures in both the PS and CS domains.

VLR/MSC Server 1028 provides user location functionality. When MS 1002 enters a new network location, it begins a registration procedure. A MSC server for that location transfers the location information to the VLR for the area. A VLR and MSC server may be located in the same computing environment, as is shown by VLR/MSC server 1028, or alternatively may be located in separate computing environments. A VLR may contain, but is not limited to, user information such as the IMSI, the Temporary Mobile Station Identity (TMSI), the Local Mobile Station Identity (LMSI), the last known location of the mobile station, or the SGSN where the mobile station was previously registered. The MSC server may contain information such as, but not limited to, procedures for MS 1002 registration or procedures for handover of MS 1002 to a different section of core network 1010. GMSC server 1030 may serve as a connection to alternate GMSC servers for other MSs in larger networks.

EIR 1044 is a logical element which may store the IMEI for MS 1002. User equipment may be classified as either "white listed" or "black listed" depending on its status in the network. If MS 1002 is stolen and put to use by an unauthorized user, it may be registered as "black listed" in EIR 1044, preventing its use on the network. A MME 1046 is a control node which may track MS 1002 or UE 1024 if the devices are idle. Additional functionality may include the ability of MME 1046 to contact idle MS 1002 or UE 1024 if retransmission of a previous session is required.

As described herein, a telecommunications system wherein management and control utilizing a software designed network (SDN) and a simple IP are based, at least in part, on user equipment, may provide a wireless management and control framework that enables common wireless management and control, such as mobility management, radio resource management, QoS, load balancing, etc., across many wireless technologies, e.g. LTE, Wi-Fi, and future 5G access technologies; decoupling the mobility control from data planes to let them evolve and scale independently; reducing network state maintained in the network based on user equipment types to reduce network cost and allow massive scale; shortening cycle time and improving network upgradability; flexibility in creating end-to-end services based on types of user equipment and applications, thus improve customer experience; or improving user equipment power efficiency and battery life—especially for simple M2M devices—through enhanced wireless management.

While examples of a telecommunications system in which emergency alerts can be processed and managed have been described in connection with various computing devices/processors, the underlying concepts may be applied to any computing device, processor, or system capable of facilitating a telecommunications system. The various techniques described herein may be implemented in connection with hardware or software or, where appropriate, with a combination of both. Thus, the methods and devices may take the form of program code (i.e., instructions) embodied in concrete, tangible, storage media having a concrete, tangible, physical structure. Examples of tangible storage media include floppy diskettes, CD-ROMs, DVDs, hard drives, or any other tangible machine-readable storage medium (computer-readable storage medium). Thus, a computer-readable storage medium is not a signal. A computer-readable storage medium is not a transient signal. Further, a computer-readable storage medium is not a propagating signal. A computer-readable storage medium as described herein is an article of manufacture. When the program code is loaded into and executed by a machine, such as a computer, the machine becomes an device for telecommunications. In the case of program code execution on programmable computers, the computing device will generally include a processor, a storage medium readable by the processor (including volatile or nonvolatile memory or storage elements), at least one input device, and at least one output device. The program(s) can be implemented in assembly or machine language, if desired. The language can be a compiled or interpreted language, and may be combined with hardware implementations.

The methods and devices associated with a telecommunications system as described herein also may be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, or the like, the machine becomes an device for implementing telecommunications as described herein. When implemented on a general-purpose processor, the program code combines with the processor to provide a unique device that operates to invoke the functionality of a telecommunications system.

EXAMPLES

Example 1

A system for expansive network control comprising: a development engine includes a scenario building engine configured to build an abstracted view of at least one sub-network based on a network inventory; a gamification engine communicates with a user input/output device providing at least one simulated scenario involving a simulated network threat to the user input/output device; and a machine learning engine communicating with the gamification engine, wherein the machine learning engine generates at least one strategy, the machine learning engine capturing the scenario and the user input from the user input/output device; an expansive network control operation engine includes an expansive network control engine communicates with the machine learning engine; an execution engine communicates with the expansive network control engine; a threat detection engine communicates with at least one external threat data source, the at least one external threat data source including at least one of weather, seismic, natural disaster, law enforcement, news and public utility data; wherein the threat detection engine monitors the at least one data source to detect a threat and passes a threat type and an impacted sub-network location for the threat type to the expansive network control engine; wherein the expansive network control engine is configured to retrieve at least one of an available inventory and priority of the impacted sub-network; wherein based on the at least one strategy, the expansive network control engine triggers the execution engine to perform an action to address the threat; an expansive network planning engine includes a simulation engine; the simulation engine configured to trigger an event and record a simulation result of the event; and a spare recommender, wherein the simulation engine communicates the simulation result to the spare recommender and wherein the spare recommender analyzes the simulation result to determine if excessive spares exist.

Example 2

The system of example 1, wherein the control engine communicates with the scenario building engine; the control engine being configured to notify the scenario building engine upon detecting a threat for which the control engine lacks a scenario.

Example 3

The system of example 1, wherein the gamification engine provides plural scenarios to the user input/output device, wherein the plural scenarios range in difficulty from a novice level to an expert level.

Example 4

The system of example 1, wherein the gamification engine assigns a score based on at least one user input from the user input/output in response to the scenario.

Example 5

The system of example 1, wherein the expansive network control engine communicates a feedback including at least one of a status of the impacted sub-network, a network control action, and a network control result to the machine learning engine, the machine learning engine analyzing the strategy based on the feedback.

Example 6

The system of example 1, wherein the control engine communicates with at least one date source, wherein the at least one data source includes an active and available inventory database.

Example 7

The system of example 1, wherein control engine communicates with at least one threat data source, wherein the threat data source includes at least one of a weather, a seismic, a volcanic, and a satellite data sources; an unnatural and natural disaster data sources; a law enforcement data source, a government data source; a social media data source; a news data source, and a public utility data source.

Example 8

The system of example 1 further comprising an operations input/output device, wherein the control engine communicates with the operations input/output device to provide at least one of a threat alert and a control status.

Example 9

The system of example 1 wherein the control engine is in communication with the scenario building engine and alerts the scenario building engine if a threat for which there is no scenario is encountered.

Example 10

The system of example 9, wherein the scenario building engine generates a scenario for the threat for which there is no scenario, communicates the scenario to at least one of the gamification engine and machine learning engine to create a strategy for the scenario and communicate it to the control engine.

Example 11

A network device comprising: a processor, an input/output device coupled to the processor, and a memory coupled with the processor, the memory comprising executable instructions that when executed by the processor cause the processor to effectuate operations comprising: instantiating a scenario building engine as a virtual network function; instantiating a network control engine as a virtual network function; instantiating a gamification engine as a virtual network function; instantiating a machine learning engine as a virtual network function; providing a resource inventory for at least a portion of the network to the scenario building engine; building a scenario based on the resource inventory, wherein the scenario includes at least one threat to the resource inventory; and at least one of the gamification engine and the machine learning engine defining a strategy for response to the threat; providing the strategy to the network control engine.

Example 12

The network device of example 11, wherein the processor further effectuates operations comprising: instantiating a threat detection engine communicating with at least one threat data source, detecting at least one potential threat and communicating the threat to the network control engine, wherein the network control engine implements the strategy taking an action responsive to the potential threat.

Example 13

The network device of example 12, wherein the processor further effectuates operations comprising reporting the result of the action to the machine learning engine, wherein the machine learning engine analyzes the scenario based on the action to prepare a second strategy.

Example 14

The network device of example 11, wherein the input/output device receives a subject matter expert input and communicates the subject matter expert input to the scenario building engine.

Example 15

The network device of example 11, wherein input/output includes a user input/output and wherein the gamification engine delivers the scenario to a user input/output device and prompts the user for a user strategy responsive to the threat.

Example 16

The network device of example 15, wherein the user strategy is captured in memory and analyzed by the machine learning engine in comparison to the strategy.

Example 17

The network device of example 16, wherein the gamification engine generates a score base on the comparison.

Example 18

The network device of example 11, wherein at least one of the scenario building engine and gamification engine develop plural scenarios of varying difficulty and selectively communicate them to the input/output device based on a level of user input.

Example 19

The network device of example 11, wherein the process further effectuates operations comprising: instantiating a simulation engine and a spare recommender, the simulation engine communicating a spares required report to the spare recommender, the spare recommender analyzes the spares required report to determine if a sufficient spare supply is available.

Example 20

The network device of example 11 wherein the input/output includes an operations input/output, wherein the network control engine communicates at least one of a threat and a control status to the operations input/output.

The invention claimed is:
1. A system for expansive network control comprising:
 a development engine includes
  a scenario building engine configured to build an abstracted view of at least one sub-network based on a network inventory;
  a gamification engine communicating with a user input/output device providing at least one simulated scenario involving a simulated network threat to the user input/output device; and
  a machine learning engine communicating with the gamification engine, wherein the machine learning engine generates at least one strategy, the machine learning engine capturing the scenario and the user input from the user input/output device;
 an expansive network control operation engine includes
  an expansive network control engine communicating with the machine learning engine;
  an execution engine communicating with the expansive network control engine;
  a threat detection engine communicating with at least one external threat data source, the at least one external threat data source including at least one of weather, seismic, natural disaster, law enforcement, news and public utility data;
  wherein the threat detection engine monitors the at least one data source to detect a threat and passes a threat type and an impacted sub-network location for the threat type to the expansive network control engine;
  wherein the expansive network control engine is configured to retrieve at least one of an available inventory and priority of the impacted sub-network; wherein based on the at least one strategy, the expansive network control engine triggers the execution engine to perform an action to address the threat;
 an expansive network planning engine includes
  a simulation engine; the simulation engine configured to trigger an event and record a simulation result of the event; and
  a spare recommender, wherein the simulation engine communicates the simulation result to the spare recommender and wherein the spare recommender analyzes the simulation result to determine if excessive spares exist.
2. The system of claim 1, wherein the control engine communicates with the scenario building engine; the control engine being configured to notify the scenario building engine upon detecting a threat for which the control engine lacks a scenario.

3. The system of claim 1, wherein the gamification engine provides plural scenarios to the user input/output device, wherein the plural scenarios range in difficulty from a novice level to an expert level.

4. The system of claim 1, wherein the gamification engine assigns a score based on at least one user input from the user input/output in response to the scenario.

5. The system of claim 1, wherein the expansive network control engine communicates a feedback including at least one of a status of the impacted sub-network, a network control action, and a network control result to the machine learning engine, the machine learning engine analyzing the strategy based on the feedback.

6. The system of claim 1, wherein the control engine communicates with at least one date source, wherein the at least one data source includes an active and available inventory database.

7. The system of claim 1, wherein control engine communicates with at least one threat data source, wherein the threat data source includes at least one of a weather, a seismic, a volcanic, and a satellite data sources; an unnatural and natural disaster data sources; a law enforcement data source, a government data source; a social media data source; a news data source, and a public utility data source.

8. The system of claim 1 further comprising an operations input/output device, wherein the control engine communicates with the operations input/output device to provide at least one of a threat alert and a control status.

9. The system of claim 1 wherein the control engine is in communication with the scenario building engine and alerts the scenario building engine if a threat for which there is no scenario is encountered.

10. The system of claim 9, wherein the scenario building engine generates a scenario for the threat for which there is no scenario, communicates the scenario to at least one of the gamification engine and machine learning engine to create a strategy for the scenario and communicate it to the control engine.

* * * * *